United States Patent
Yamada et al.

(10) Patent No.: US 6,728,526 B2
(45) Date of Patent: Apr. 27, 2004

(54) FRACTIONAL-N FREQUENCY SYNTHESIZER WITH MULTIPLE CLOCKS HAVING DIFFERENT TIMINGS

(75) Inventors: Ryoichi Yamada, Kanagawa (JP); Shunsuke Hirano, Kanagawa (JP); Yasunori Miyahara, Kanagawa (JP); Hisashi Adachi, Osaka (JP); Hisashi Takahashi, Osaka (JP); Hiroki Kojima, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 629 days.

(21) Appl. No.: 09/794,185

(22) Filed: Feb. 26, 2001

(65) Prior Publication Data

US 2001/0036817 A1 Nov. 1, 2001

(30) Foreign Application Priority Data

Apr. 17, 2000 (JP) .................................. P. 2000-115190

(51) Int. Cl.⁷ .............................. H04B 1/06; H04B 7/00
(52) U.S. Cl. .......................... 455/260; 455/76; 331/16; 331/1 A
(58) Field of Search ................................ 455/260, 255, 455/147, 196.1, 198.1, 208, 313, 316, 318, 76; 331/1 A, 16, 25; 377/48; 327/105, 115, 117; 375/316

(56) References Cited

U.S. PATENT DOCUMENTS

| 4,609,881 A | 9/1986 | Wells |
| 4,816,774 A * | 3/1989 | Martin ........................ 331/1 A |
| 5,070,310 A | 12/1991 | Hietala et al. |
| 5,166,642 A * | 11/1992 | Hietala ........................ 331/1 A |
| 5,694,089 A * | 12/1997 | Adachi et al. ................. 331/16 |
| 5,777,521 A * | 7/1998 | Gillig et al. .................. 331/16 |
| 6,308,049 B1 * | 10/2001 | Bellaouar et al. ............. 455/76 |

FOREIGN PATENT DOCUMENTS

| EP | 0 344 509 | 12/1989 |
| JP | 2844389 | 4/1993 |
| JP | 08-008741 | 1/1996 |
| JP | 8008741 | 12/1996 |

* cited by examiner

Primary Examiner—Edward F. Urban
Assistant Examiner—Blane J. Jackson
(74) Attorney, Agent, or Firm—Pearne & Gordon LLP

(57) ABSTRACT

A frequency synthesizer device comprising a PLL circuit (9) and a frequency-division ratio control circuit (5). The PLL circuit (9) includes a phase comparator (1), a low-pass filter (2), a voltage-controlled oscillator (3), and a variable frequency divider (4). The frequency-division ratio control circuit (5) controls the variable frequency divider (4) such that a frequency division ratio of the variable frequency divider (4) is changed in time and a time average value of the frequency division ratio contains a value below a decimal point. Two different signals of an output signal fdiv of the variable frequency divider (4) and an output fdiv2 obtained via a delay element (10) are used as clocks of an accumulator portion (81) in the frequency-division ratio control circuit (5). The variation in the substrate potential and the variation in the power supply voltage generated by the operation of the frequency-division ratio control circuit (5) can be reduced, and the degradation of C/N of the frequency synthesizer can be suppressed.

19 Claims, 25 Drawing Sheets

FRACTIONAL-N FREQUENCY SYNTHESIZER WITH MULTIPLE CLOCKS HAVING DIFFERENT TIMINGS

BACKGROUND OF THE INVENTION

The present invention relates to a frequency synthesizer device and a mobile radio device using the same and, more particularly, a frequency synthesizer device in which noises in the fractional-N system are reduced and a mobile radio device using the same.

The frequency synthesizer device is used to produce the carrier wave with any frequency from the reference signal. In the case of the mobile radio device, the frequency synthesizer device of high-speed lock up is requested to attain a high C/N and low power consumption in the intermittent reception, etc. In the case of the normal frequency synthesizer device, the setting interval of the output frequency of the voltage-controlled oscillator is limited by the comparison frequency of the phase comparator. In order to obtain the finer setting interval, the comparison frequency must be lowered, so that the lock-up time cannot be shortened. As the frequency synthesizer device that can reduce the lock-up time, there is the frequency synthesizer device that is called the fractional-N system.

A configuration of the frequency synthesizer device is shown in FIG. 21. In FIG. 21, PLL (Phase-Locked Loop) circuit 9 including a phase comparator 1, a low-pass filter (LPF) 2, a voltage-controlled oscillator 3 and a variable frequency divider 4 is provided in the frequency synthesizer device. The voltage-controlled oscillator (VCO) 3 is a circuit that oscillates a signal having a frequency in response to an input voltage. The variable frequency divider 4 is a circuit that frequency-divides the frequency of the output signal (fvco) of the VCO. The phase comparator 1 is a circuit that compares phase of an output signal (fdiv) of the variable frequency divider 4 with phase of the reference signal (fref) to output a phase difference. The low-pass filter 2 is a circuit that smoothes an output of the phase comparator 1. A frequency-division ratio control circuit 5 is a circuit that controls a frequency-division ratio by using the fdiv as a clock such that the frequency-division ratio is changed in time and a value of its time average contains a value below the decimal point.

The frequency-division ratio control circuit 5 comprises an accumulator portion 80, a fractional part calculator circuit 70, and a frequency-division ratio adder 6. The accumulator portion 80 is a circuit that outputs accumulated results of fractional part data, that are set externally, at a timing of fdiv. The fractional part calculator circuit 70 is a circuit that adds output results of the accumulator portion 80 every timing of fdiv. The frequency-division ratio adder 6 is a circuit that adds the result calculated by the fractional part calculator circuit 70 and integer part data that are set externally. The added result in the frequency-division ratio adder 6 gives a frequency-division ratio of the variable frequency divider 4. Because of control of this frequency-division ratio control circuit 5, there is no necessity that the frequency of fvco should be set to integral multiple of the frequency of fref. Thus, the frequency of fref can be set higher irrespective of the desired frequency interval in fvco. Therefore, the lock-up time can be reduced. At this time, if the frequency-division ratio of the variable frequency divider is simply changed periodically, frequency components of the change period are generated in the VCO output as spurious. In order to avoid this, as set forth in U.S. Pat. No. 4,609,881, Japanese Patent No. 2844389, and Japanese Patent Publication No. Hei 8-8741, for example, there is the approach employing a plurality of accumulators that are connected in multiple-stage fashion.

A configuration of the accumulator portions that are connected in multiple-stage fashion is shown in FIG. 22. Each of the accumulators 801 to 804 having an adder and a register, and operates by using fdiv as the clock. The accumulator 801 at the first stage adds fractional part data that are set by the outside and an output of the register by using the adder, and then updates a value of the register. The accumulator 802 at the second stage adds an output of the register and an output of the adder in the accumulator 801 by using the adder, and then updates a value of the register. The accumulator 803 and the accumulator 804 perform the same operation as the accumulator 802. Behaviors of change in the operations of the adders and the clocks of the registers in the accumulators connected in this manner are shown in a timing chart in FIG. 23. The registers update the data supplied from the adders in synchronism with fdiv. The adder repeats the operation of the fractional part data and the output of the adder at the former stage, and then transmits the result to the later stage. In contrast, the adder in the accumulator outputs the carry signal of the most significant bit as the carry signal and then inputs it to the fractional part calculator circuit 70.

A configuration of the fractional part calculator circuit 70 is shown in FIG. 24. In FIG. 24, an adder 701 is a circuit that calculates the fractional part by adding binomial coefficients. The delay circuits 702 to 707 are circuits that delay the carry signals of the accumulators to generate sequentially the binomial coefficient represented by the Pascal's triangle. The fractional part calculator circuit 70 operates with respect to the carry signals generated from respective accumulators as follows. That is, when the carry signal is input from the accumulator 801, the circuit generates +1. When the carry signal is input from the accumulator 802, the circuit generates +1 and then generates −1 after one clock. When the carry signal is input from the accumulator 803, the circuit generates +1, then generates −2 after one clock, and then generates +1 after two clocks. When the carry signal is input from the accumulator 804, the circuit generates +1, then generates −3 after one clock, then generates +3 after two clocks, and then generates −1 after three clocks. This behavior is shown in a timing chart in FIG. 25. The accumulators are operated at the timing of fdiv, and the adders overflows to output the carry signal. The delay units that are connected to the carry signals of the accumulator 802, the accumulator 803, and the accumulator 804 delay the carry signal every fdiv period using fdiv as the clock. The adder 701 adds the carry signals output at respective stages at the same timing of fdiv and outputs the result.

The frequency-division ratio adder 6 adds the integer part data that are set externally and the output of the adder 701. The result of the adder is the output of the frequency-division ratio control circuit 5 to set the frequency-division ratio of the variable frequency divider 4. This frequency-division ratio is changed substantially every timing of fdiv, whereby the frequency component in change of the frequency-division ratio is set high and thus the low frequency component is reduced.

The change in the frequency-division ratio caused by the carry signals that are generated from the accumulator 802, the accumulator 803, and the accumulator 804 become zero in time average respectively, and it does not affect the average frequency-division ratio. Therefore, only the carry signal generated from the accumulator 801 contributes the average frequency-division ratio.

However, in such frequency synthesizer device in the background art, all registers in respective accumulator portions update the data in synchronism with fdiv, and the adders perform the calculation in response to every data update in the registers and every change in the adder outputs in the former stages and then transmit results to the later stages. Hence, operations of a plurality of accumulators are concentrated to one timing, and the circuit operation time required for the transmission of the operation is extended. In the integrated circuit in which analogue circuits and digital circuits are integrated on the same semiconductor substrate, since the maximum power is consumed at change points of the clock for the digital circuits, potential of the semiconductor substrate and potential of the power supply are varied in synchronism with the clock. Therefore, there are problems such that variation in these potential generates the noise, degrades the C/N of the frequency synthesizer device, and prevents the realization of high C/N and high-speed lock-up.

Also, there is another problem such that, as the comparison frequency is set higher to put the feature of the fractional-N system to practical use, the noise generated by the frequency-division ratio control circuit is increased to increase the C/N degradation. In addition, there is another problem such that, if both the transmitter portion and the receiver portion are integrated on the same semiconductor substrate even though the characteristics as the frequency synthesizer device can be satisfied, the transmitting/receiving characteristics are degraded because of the interference of the noise generated by the frequency-division ratio control circuit. Further, there is another problem such that, if the lock-up time is delayed to assure the C/N, the power consumption in the intermittent operation of the mobile radio device is increased and also the standby time is shortened.

SUMMARY OF THE INVENTION

The present invention has been made to overcome such problems, and it is an object of the present invention to provide a frequency synthesizer device capable of reducing noises generated by a frequency-division ratio control circuit to improve a C/N ratio, reducing a lock-up time, and reducing a power consumption and a mobile radio device using the same.

In order to overcome the above subjects, in the present invention, there is provided a frequency synthesizer device comprising: a PLL circuit that includes a reference signal inputting means, a phase comparator, a low-pass filter, a voltage-controlled oscillator, and a variable frequency divider; and a frequency-division ratio control circuit including a plurality of accumulators for controlling the variable frequency divider such that a frequency division ratio of the variable frequency divider is changed in time and a time average value of the frequency division ratio contains a value below a decimal point and each having a register and an adder, a fractional part calculator circuit for receiving a carry signal generated by the adder to add binomial coefficients in sequence, and a frequency-division ratio adder for adding an output of the fractional part calculator circuit and integer part data to set the frequency division ratio in the variable frequency divider, wherein the frequency-division ratio control circuit is operated at a plurality of clocks having different timings, whereby a signal having a frequency that is equal to a product of the time average value of the frequency division ratio and a frequency of a reference signal is generated.

According to such configuration, the variation in the substrate potential and the variation in the power supply voltage generated by the operation of the frequency-division ratio control circuit can be reduced. Therefore, the degradation of C/N of the frequency synthesizer can be reduced, and also the lock-up time can be reduced. In addition, the power consumption in the intermittent operation can be reduced, and also the influence of the noises on other blocks constructed on the same substrate can be reduced.

DETAILED DESCRIPTION OF THE PREFERRED EMBODIMENT

Embodiments of the present invention will be explained in detail with reference to FIG. 1 to FIG. 20 hereinafter. In this case, the same references are affixed to the same members as those in the background art shown in FIG. 21 and their detailed explanation will be omitted (First Embodiment)

A first embodiment of the present invention provides a frequency synthesizer device in which a delay element is provided to the frequency-division ratio control circuit and also an output signal of a variable frequency divider and a delayed signal obtained by delaying the output signal by the delay element are employed as operation clocks of an accumulator portion.

Figure 1:
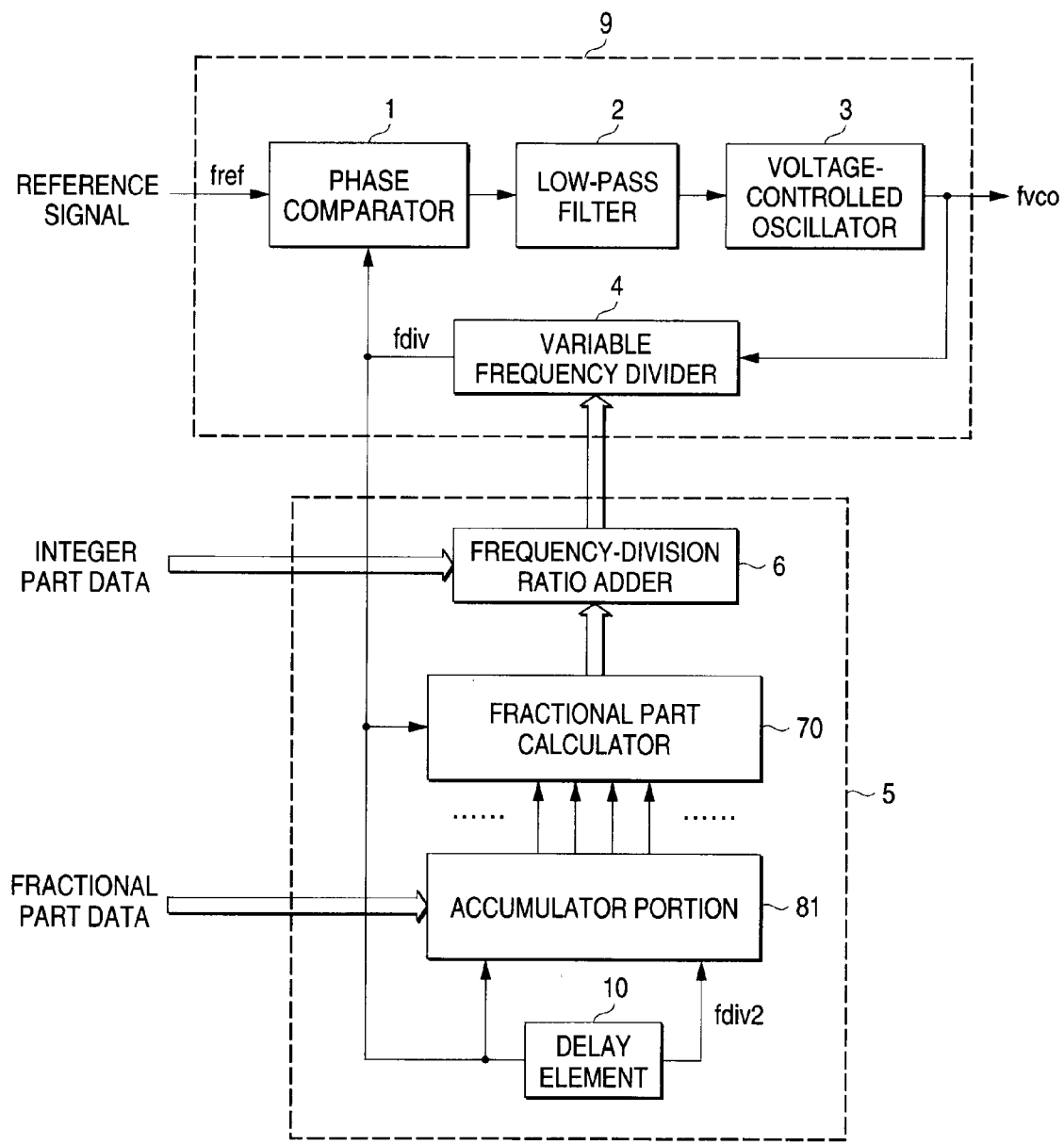
FIG. 1 is a view showing a configuration of a frequency synthesizer device according to a first embodiment of the present invention.

FIG. 1 is a view showing a configuration of the frequency synthesizer device according to the first embodiment of the present invention. In FIG. 1, a PLL (Phase-Locked Loop) circuit including a phase comparator 1, a low-pass filter 2, a voltage-controlled circuit 3, and a variable frequency divider 4 and a frequency-division ratio control circuit 5 are provided. The voltage-controlled oscillator 3 is a circuit that oscillates a signal having a frequency in response to an input voltage. The variable frequency divider 4 is a circuit that frequency-divides a frequency of an output signal of the voltage-controlled oscillator 3. The phase comparator 1 is a circuit that outputs a signal of phase difference between the variable frequency divider 4 and the reference signal to the voltage-controlled oscillator 3 via a low-pass filter 2. The frequency-division ratio control circuit 5 is a circuit that controls the variable frequency divider 4 such that a frequency-division ratio of the variable frequency divider 4 is changed in time and a time average value contains a value below the decimal point. The frequency-division ratio control circuit 5 comprises a frequency-division ratio adder 6, a fractional part calculator circuit 70, an accumulator portion 81, and a delay element 10. The elements other than the accumulator portion 81 and the delay element 10 are similar to those in the background art shown in FIG. 21.

Figure 2:
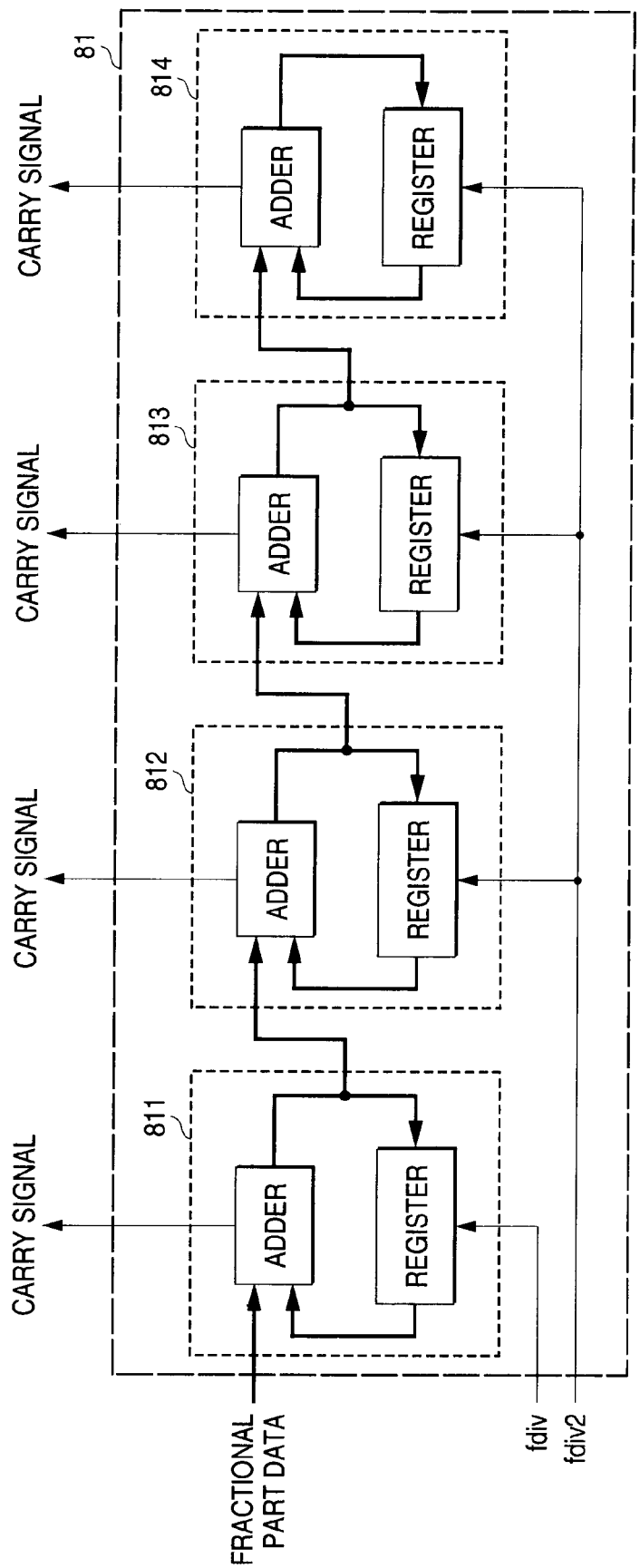
FIG. 2 is a view showing a configuration of an accumulator of the frequency synthesizer device according to the first embodiment of the present invention.
Figure 3:
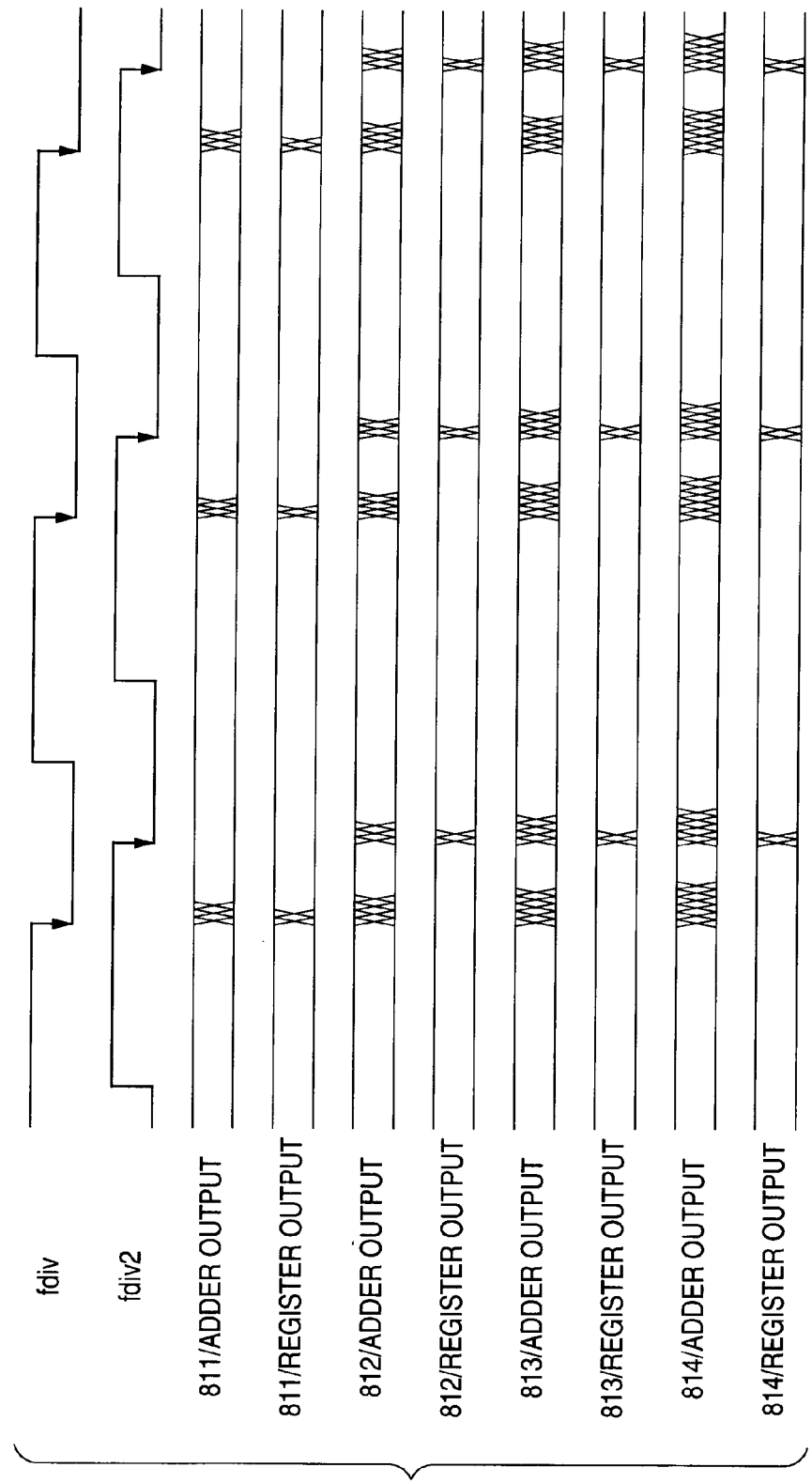
FIG. 3 is a timing chart of the accumulator of the frequency synthesizer device according to the first embodiment of the present invention.

FIG. 2 is a view showing a configuration of the accumulator portion 81. The accumulator portion 81 includes accumulators 811 to 814. Each accumulator has an adder and a register. FIG. 3 is a timing chart showing behaviors of change in the operations of the adders and the registers by the clocks in respective accumulators.

An operation of the frequency synthesizer device as constructed as above according to the first embodiment of the present invention will be explained hereunder. Operations of the elements other than the frequency-division ratio control circuit 5 are similar to those in the background art shown in FIG. 21. An output fdiv of the variable frequency divider 4 and an output fdiv2 of the delay element 10 are input into the accumulator portion 81 shown in FIG. 1 as clocks.

The accumulator 811 at the first stage shown in FIG. 2 adds fractional part data that are set by the outside and an output of the register using fdiv as the clock by using the adder, and then updates a value of the register. The accumulator 812 at the second stage adds an output of the register using fdiv2 as the clock and an output of the adder in the accumulator 811 by using the adder, and then updates a value of the register. The accumulators 813, 814 execute the same operation as the accumulator 812.

Behaviors of change in the operations of the adders and the registers, by the clocks, in the accumulators connected in this manner are shown in a timing chart in FIG. 3. The register in the accumulator 811 updates the data supplied from the adder in synchronism with fdiv. The adder executes the operation in respective bits sequentially, and then outputs the carry signal if the carry occurs. The adder in the succeeding stage executes the addition when receives change in the output data of the adder at the preceding stage. Since the adding operation is repeated in this manner, the operation time is extended much more at the later stages. The register in the accumulator 812 updates the data supplied from the adder in synchronism with fdiv2. The accumulators 813, 814 update the data of the register in synchronism with fdiv2, like the accumulator 812. That is, change points of the data in the accumulator are distributed by using fdiv and fdiv2, so that the circuit operation does not concentrate into one timing.

A one-chip radio portion device can be constructed by integrating the frequency synthesizer device, the transmitter portion, and the receiver portion on the same semiconductor substrate. The frequency synthesizer device or the one-chip radio portion device can be mounted on the mobile radio device such as the mobile telephone, etc.

As described above, according to the first embodiment of the present invention, the delay element is provided to the frequency-division ratio control circuit, and also the output signal of the variable frequency divider and the delayed signal obtained by delaying the output signal are employed as the operation clocks of the accumulator portion. Therefore, the variation in the substrate potential and the variation in the power supply potential generated by the operation of the frequency-division ratio control circuit can be reduced. Also, the degradation of C/N of the frequency synthesizer can be reduced, and also the lock-up time can be reduced. In addition, the power consumption in the intermittent operation can be reduced, and also the influence of the noises upon other blocks constructed on the same substrate can be reduced.

(Second Embodiment)

A second embodiment of the present invention provides a frequency synthesizer device in which the output signal of the variable frequency divider and the reference signal are employed as operation clocks of the accumulator portion.

Figure 4:
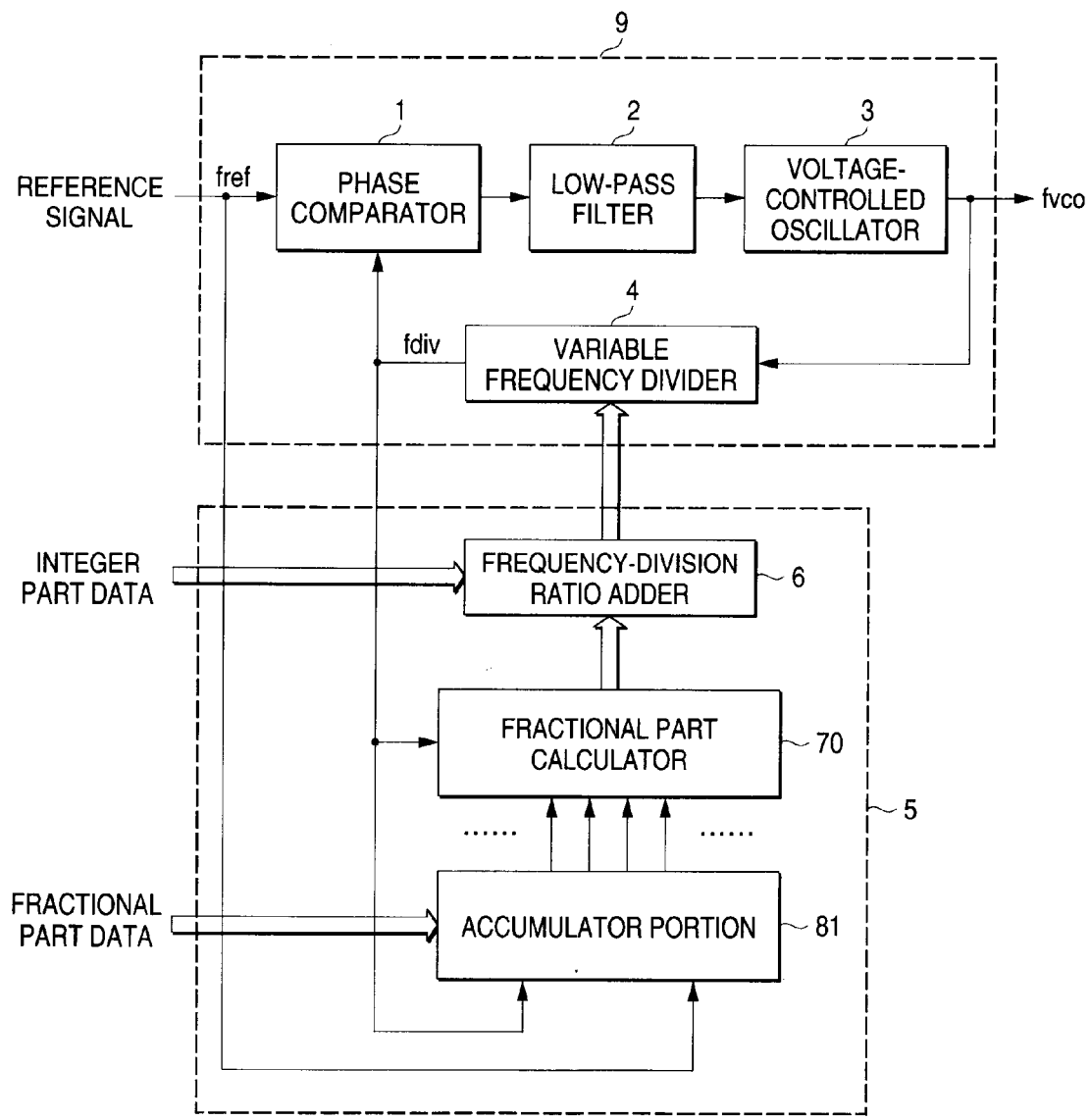
FIG. 4 is a view showing a configuration of a frequency synthesizer device according to a second embodiment of the present invention.

FIG. 4 is a view showing a configuration of a frequency synthesizer device according to a second embodiment of the present invention. A basic configuration of the second embodiment is similar to that of the first embodiment. A difference from the first embodiment is that the output fdiv of the variable frequency divider 4 and the reference signal fref are employed as the operation clocks of an accumulator portion 81.

Figure 5:
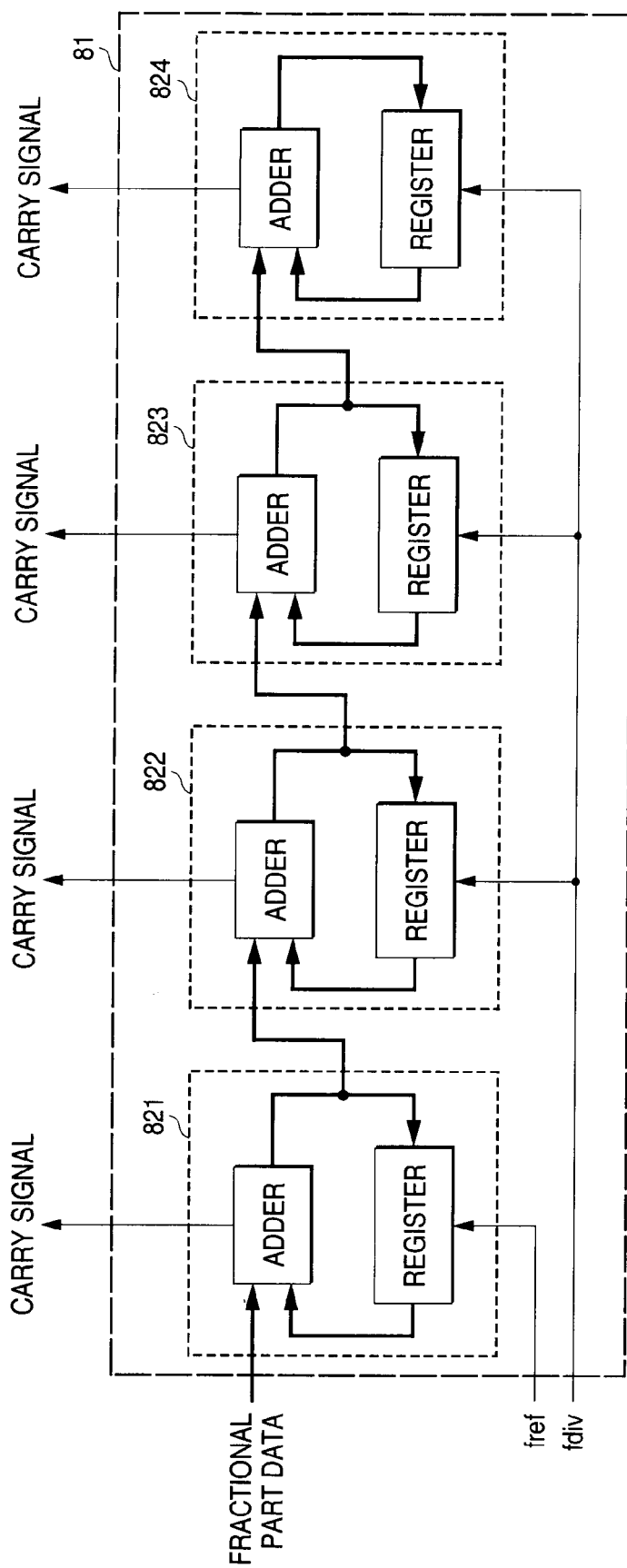
FIG. 5 is a view showing a configuration of an accumulator of the frequency synthesizer device according to the second embodiment of the present invention.
Figure 6:
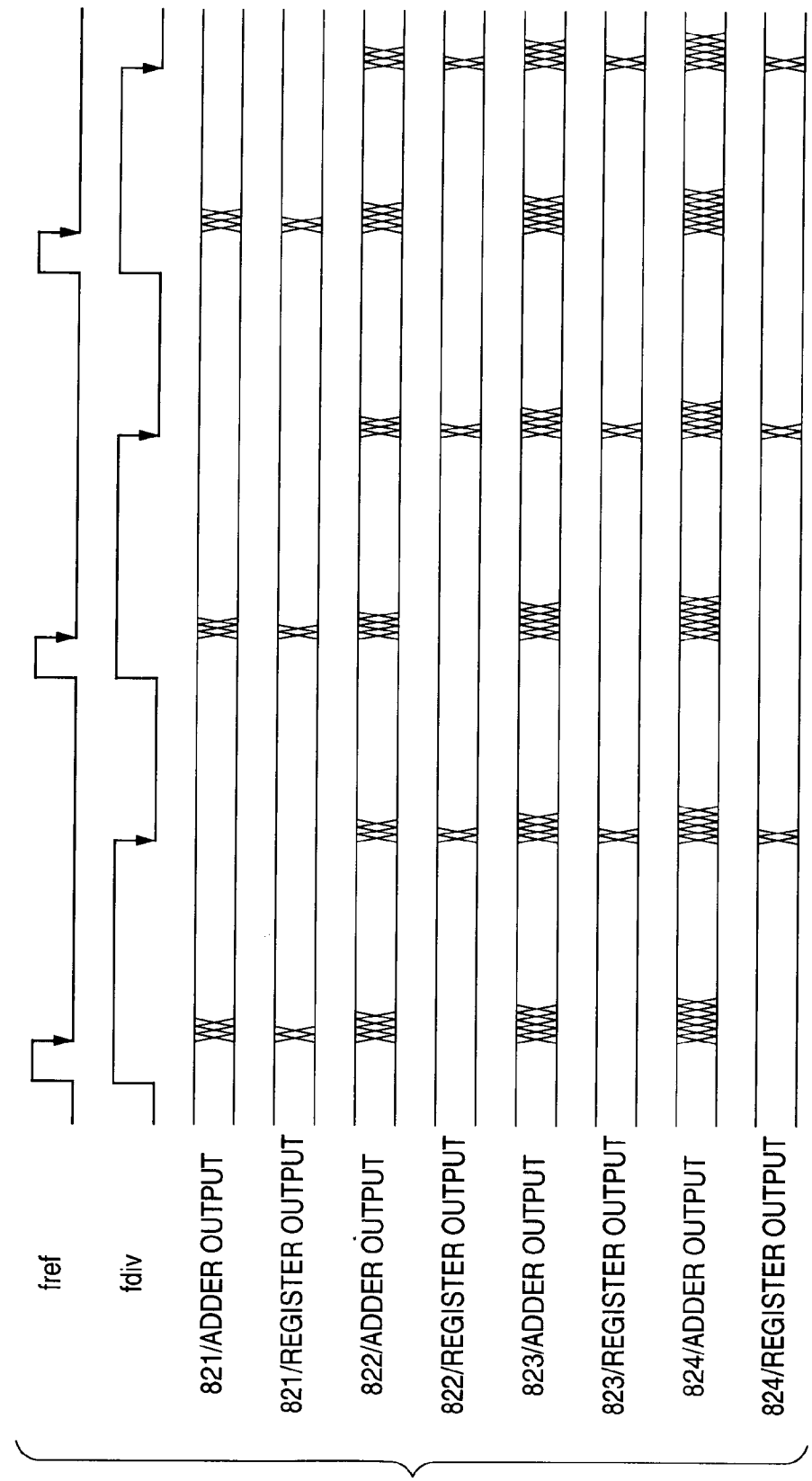
FIG. 6 is a timing chart of the accumulator of the frequency synthesizer device according to the second embodiment of the present invention.

FIG. 5 is a view showing a configuration of the accumulator portion 81. The accumulator portion 81 includes accumulators 821 to 824, and each accumulator has the adder and the register. FIG. 6 is a timing chart showing behaviors of change in the operations of the adders and the registers in respective accumulators by the clocks.

An operation of the frequency synthesizer device constructed as above according to the second embodiment of the present invention will be explained hereunder. The operations of elements other than the frequency-division ratio control circuit 5 are similar to the background art shown in FIG. 21. The output fdiv of the variable frequency divider 4 and the reference signal fref are used as the operation clocks of the accumulator portion 81.

The accumulator 821 at the first stage shown in FIG. 5 adds fractional part data that are set by the outside and an output of the register by using the adder, and then updates a value of the register using fref as the clock. The accumulator 822 at the second stage adds an output of the register and an output of the adder in the accumulator 821 by using the adder, and then updates a value of the register using fdiv as the clock. The accumulators 823, 824 execute the same operation as the accumulator 822.

Behaviors of change in the operations of the adders and the registers, by the clocks, in the accumulators connected in this manner are shown in a timing chart in FIG. 6. The register in the accumulator 821 updates the data supplied from the adder in synchronism with fref. The adder executes the operation in respective bits sequentially, and then outputs the carry signal if the carry occurs. The adder in the succeeding stage executes the addition when receives the data change of the adder at the preceding stage. Since the adding operation is repeated in this manner, the operation time is extended much more at the later stages.

The register in the accumulator 822 updates the data supplied from the adder in synchronism with fdiv. The accumulators 823, 824 update the data of the register in synchronism with fdiv, like the accumulator 822. That is, the change points of the data in the accumulator are distributed by using fref and fdiv, so that the circuit operation does not concentrate into one timing.

A one-chip radio portion device can be constructed by integrating the frequency synthesizer device, the transmitter portion, and the receiver portion on the same semiconductor substrate. The frequency synthesizer device or the one-chip radio portion device can be mounted on the mobile radio device such as the mobile telephone, etc.

As described above, according to the second embodiment of the present invention, the output signal of the variable frequency divider and the reference signal are employed as operation clocks of the accumulator portion. Therefore, the variation in the substrate potential and the variation in the power supply voltage generated by the operation of the frequency-division ratio control circuit can be reduced. Also, the degradation of C/N of the frequency synthesizer can be reduced, and also the lock-up time can be reduced. In addition, the power consumption in the intermittent operation can be reduced, and also the influence of the noises upon other blocks constructed on the same substrate can be reduced. Furthermore, the delay element can be eliminated by using fref and fdiv as the clocks. Therefore, the optimization of the delay element can also be eliminated, and in addition adjustment in phase displacement between two clock signals due to the variation of the delay element is not needed.

(Third Embodiment)

A third embodiment of the present invention provides a frequency synthesizer device in which the output signal of the variable frequency divider and the reference signal are employed as operation clocks of the accumulator portion, a plurality of accumulators are separated into two half portions in number (almost half the number if the number of the accumulators is the odd number), and the registers in the former half portion are operated by using the reference signal as the clock and the registers in the latter half portion are operated by using the output of the variable frequency divider as the clock.

Figure 7:
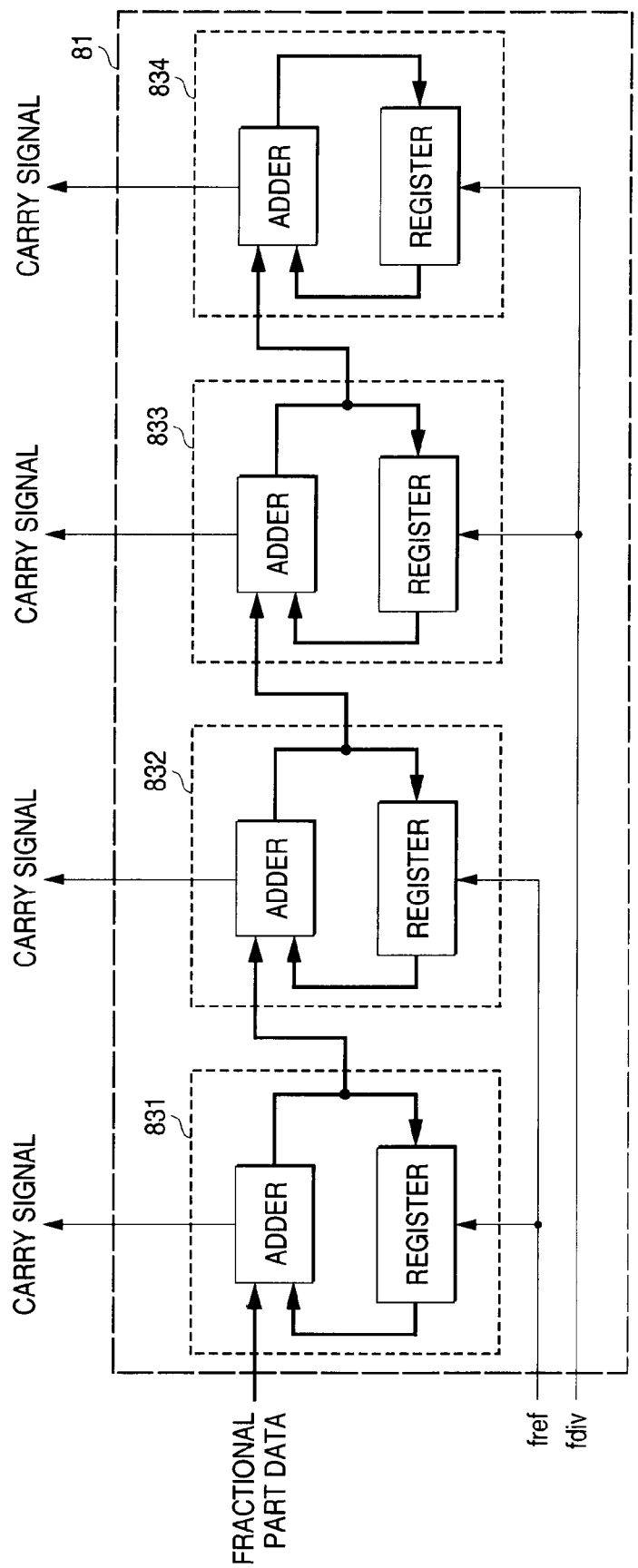
FIG. 7 is a view showing a configuration of an accumulator of a frequency synthesizer device according to a third embodiment of the present invention.

FIG. 7 is a view showing a configuration of an accumulator portion 81 of a frequency synthesizer device according to a third embodiment of the present invention. In FIG. 7, the accumulator portion 81 includes accumulators 831 to 834, and each accumulator has the adder and the register. A basic configuration of the third embodiment is similar to that of the second embodiment. A difference from the second embodiment is that the registers in the former half portion of the accumulators are operated by using the reference signal fref as the clock, and the registers in the latter half portion of the accumulators are operated by using the output fdiv of the variable frequency divider 4 as the clock.

Figure 8:
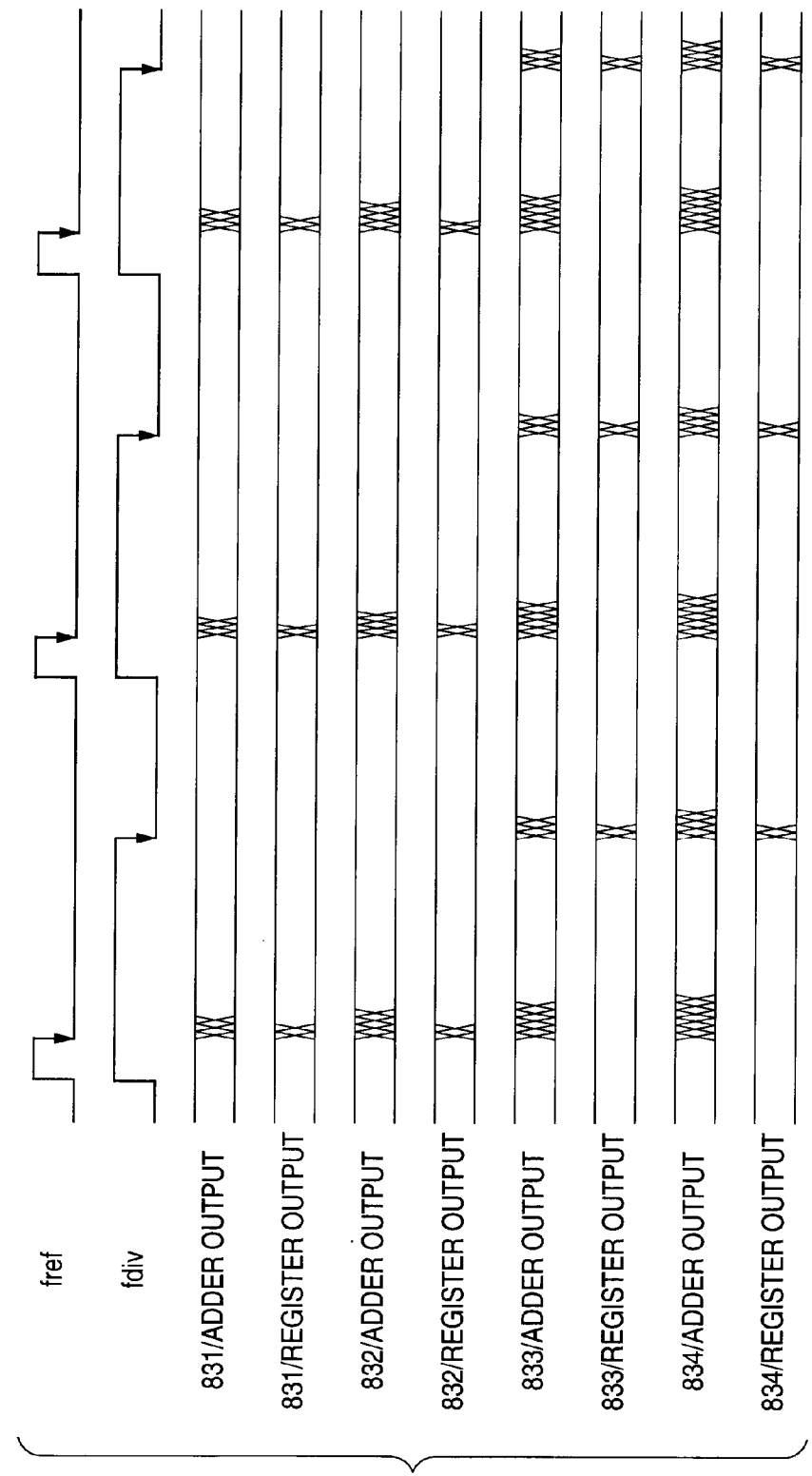
FIG. 8 is a timing chart of the accumulator of the frequency synthesizer device according to the third embodiment of the present invention.

FIG. 8 is a timing chart showing behaviors of change in the operations of the adders and the registers in the accumulators by the clocks.

An operation of the frequency synthesizer device constructed as above according to the third embodiment of the present invention will be explained hereunder. The operations of elements other than the frequency-division ratio control circuit 5 are similar to the background art shown in FIG. 21. The output fdiv of the variable frequency divider 4 and the reference signal fref are used as the operation clocks of the accumulator portion 81. The registers in the former half portion of the accumulator portion are operated by using the reference signal fref as the clock, and the registers in the latter half portion of the accumulator portion are operated by using the output fdiv of the variable frequency divider 4 as the clock.

The accumulator 831 at the first stage shown in FIG. 7 adds fractional part data that are set by the outside and an output of the register by using the adder, and then updates a value of the register using fref as the clock. The accumulator 832 at the second stage adds an output of the register and an output of the adder in the accumulator 831 by using the adder, and then updates a value of the register using fref as the clock. The accumulator 833 at the third stage and the accumulator 834 at the fourth stage add an output of the register and an output of the adder in the accumulator at the preceding stage by using the adder and then updates a value of the register using fdiv as the clock respectively.

Behaviors of change in the operations of the adders and the registers, by the clocks, in the accumulators connected in this manner are shown in a timing chart in FIG. 8. The registers in the accumulators 831, 832 update the data supplied from the adders in synchronism with fref. The adders execute the operation in respective bits in sequence, and then outputs the carry signal if the carry occurs. The adders in the succeeding stage execute the addition when receive the data change in the adder at the preceding stage. Since the adding operation is repeated in this manner, the operation time is extended much more at the later stages.

The registers in the accumulators 833, 834 update the data supplied from the adders in synchronism with fdiv. That is, the change points of the data in the accumulators are distributed by using fref and fdiv, so that the circuit operation does not concentrate into one timing. In particular, since fref and fdiv are separately used by the former and latter half portions of the accumulators, the circuit number of the accumulators that includes plural stages and are simultaneously operated can be minimized.

A one-chip radio portion device can be constructed by integrating the frequency synthesizer device, the transmitter portion, and the receiver portion on the same semiconductor substrate. The frequency synthesizer device or the one-chip radio portion device can be installed on the mobile radio device such as the mobile telephone, etc.

As described above, according to the third embodiment of the present invention, the output signal of the variable frequency divider and the reference signal are employed as operation clocks of the accumulator portion, a plurality of accumulators are separated into two half portions in number (almost half the number if the number of the accumulators is the odd number), and the registers in the former half portion are operated by using the reference signal as the clock and also the registers in the latter half portion are operated by using the output of the variable frequency divider as the clock. Therefore, the variation in the substrate potential and the variation in the power supply voltage generated by the operation of the frequency-division ratio control circuit can be reduced. Also, the degradation of C/N of the frequency synthesizer can be reduced, and also the lock-up time can be reduced. In addition, the power consumption in the intermittent operation can be reduced, and also the influence of the noises upon other blocks constructed on the same substrate can be reduced. Furthermore, since fref and fdiv are used separately by the former and latter half portions of the accumulators, the operation noises of the accumulators can be reduced rather than those in the first and second embodiments.

(Fourth Embodiment)

A fourth embodiment of the present invention provides a frequency synthesizer device in which the delay element is provided to the frequency-division ratio control circuit, the output signal of the variable frequency divider and the delayed signal of the output signal are employed as operation clocks of the accumulator portion, and a plurality of accumulators are connected to the accumulators in the succeeding stages via the outputs of the registers in respective stages.

Figure 9:
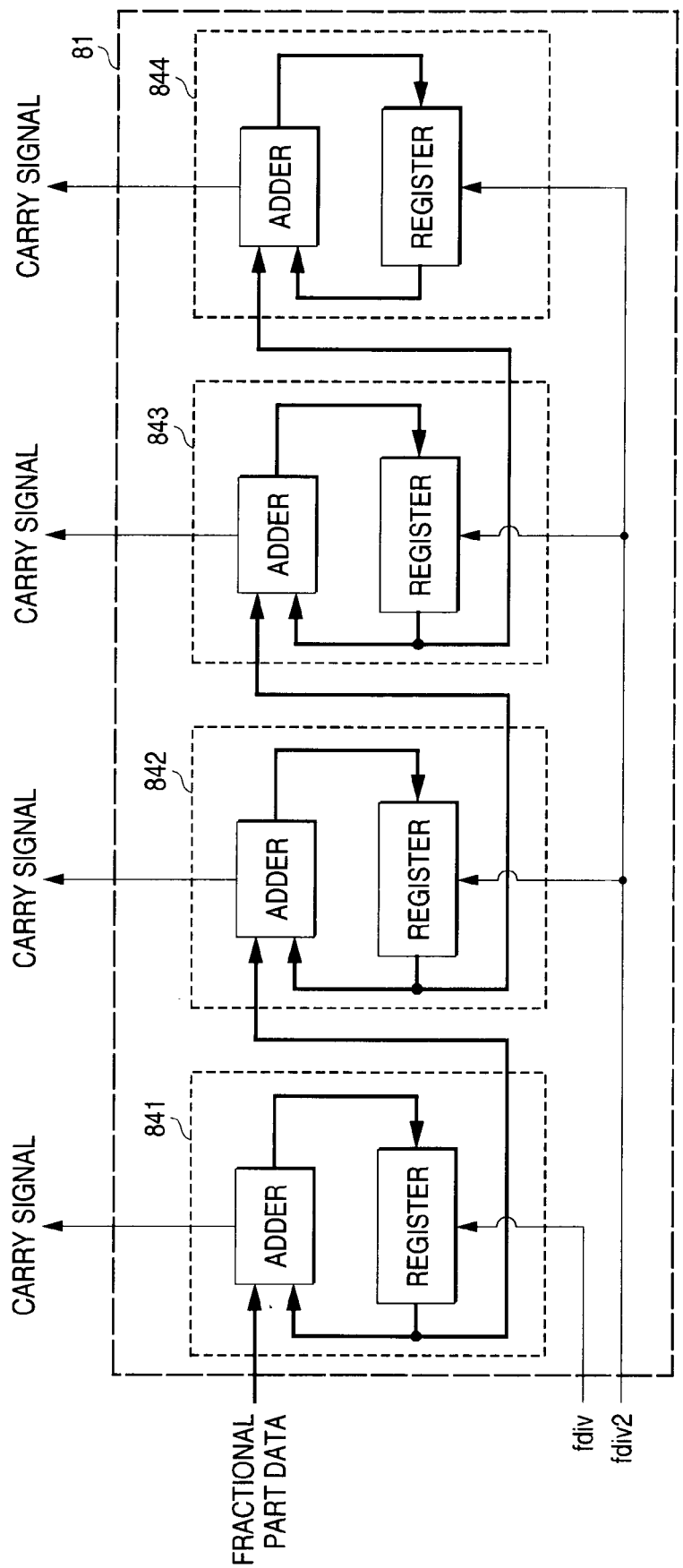
FIG. 9 is a view showing a configuration of an accumulator of a frequency synthesizer device according to a fourth embodiment of the present invention.

FIG. 9 is a view showing a configuration of an accumulator portion 81 of a frequency synthesizer device according to a fourth embodiment of the present invention. In FIG. 9, the accumulator portion 81 includes accumulators 841 to 844, and each accumulator has the adder and the register. A basic configuration of the fourth embodiment is similar to that of the first embodiment. A difference from the first embodiment is configurations of the accumulator portion 81 and the fractional part calculator circuit 70.

Figure 10:
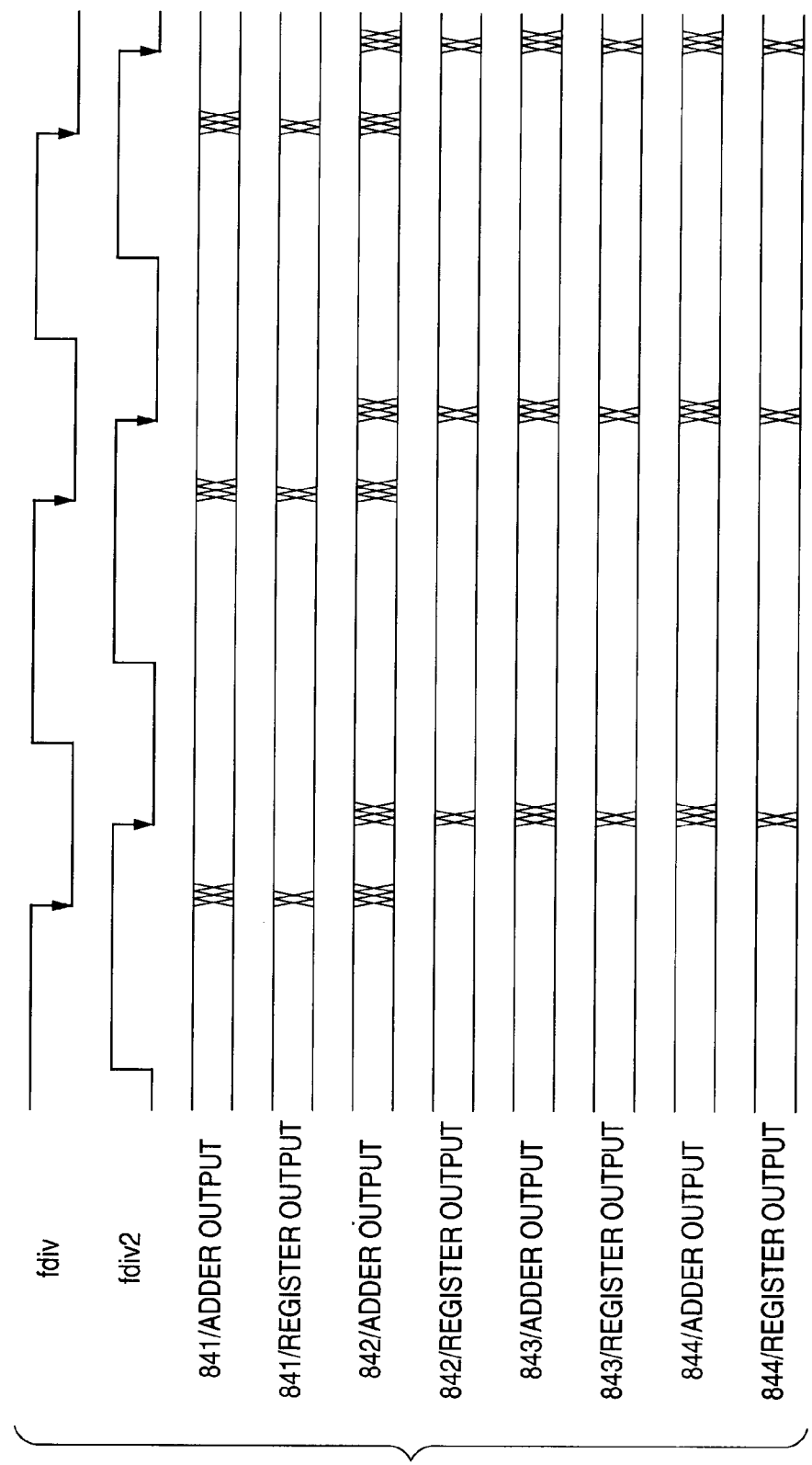
FIG. 10 is a timing chart of the accumulator of the frequency synthesizer device according to the fourth embodiment of the present invention.

FIG. 10 is a timing chart showing behaviors of change in the operations of the adders and the registers in the accumulators by the clocks.

Figure 11:
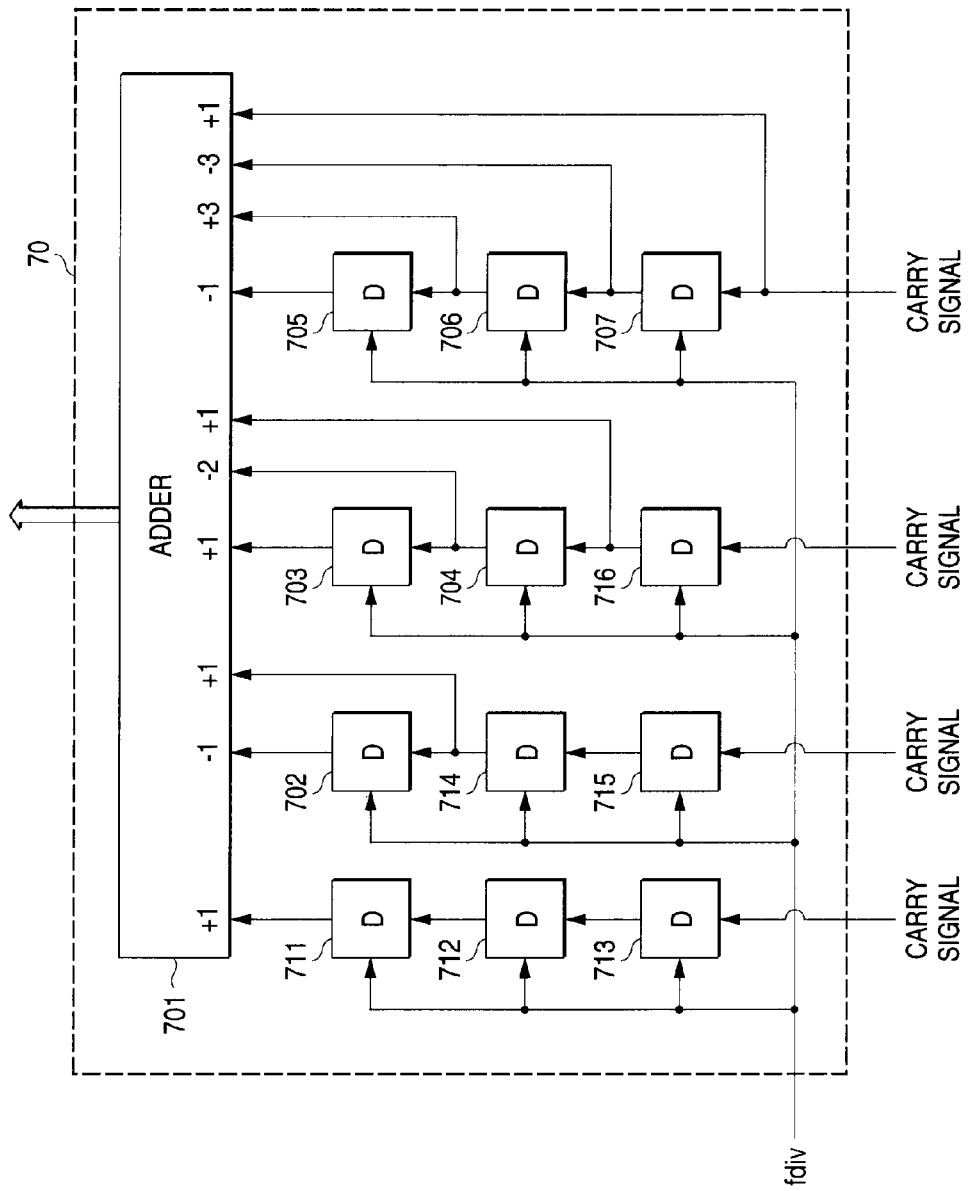
FIG. 11 is a view showing a configuration of a fractional part calculator circuit of the frequency synthesizer device according to the fourth embodiment of the present invention.
Figure 12:
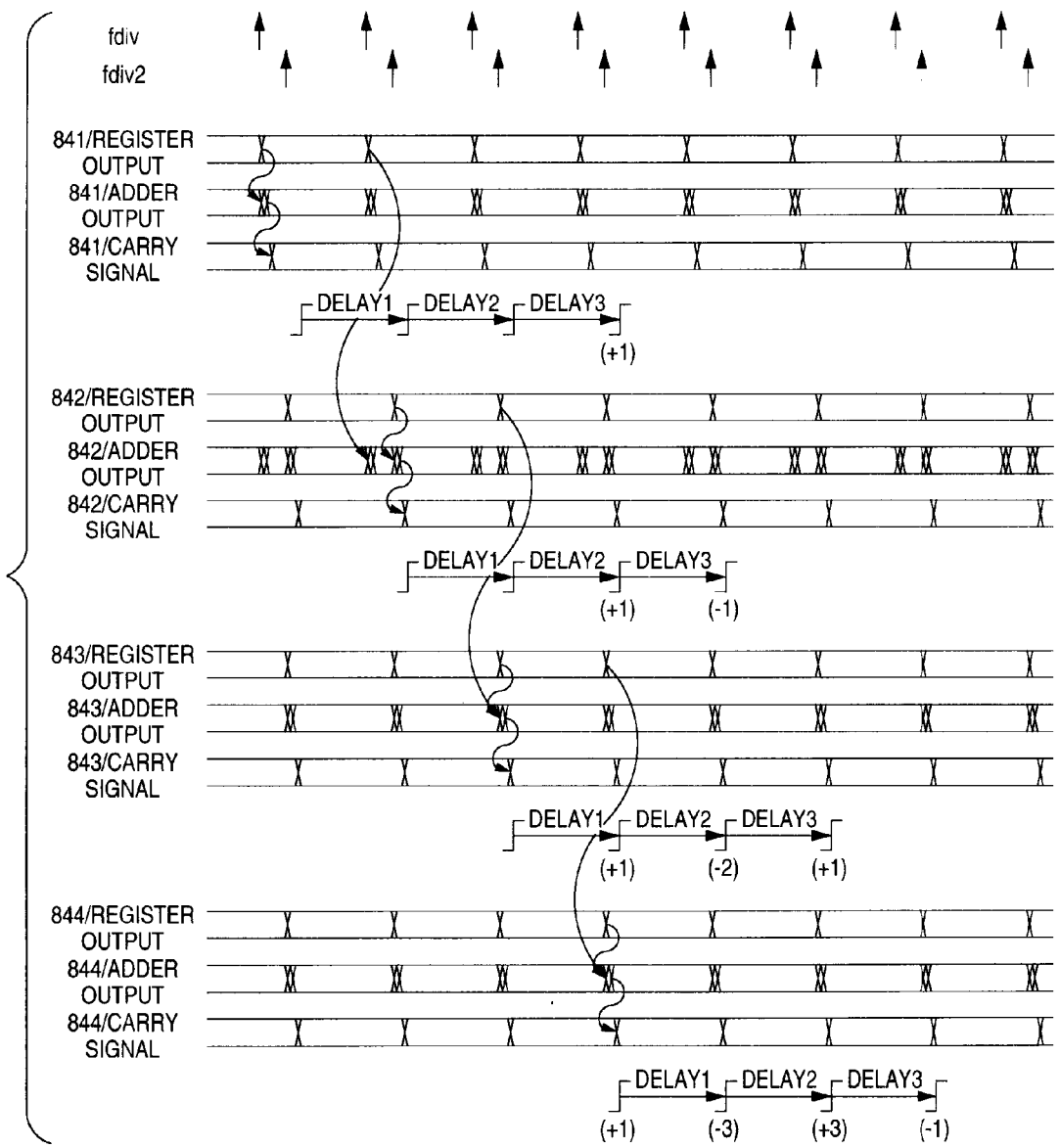
FIG. 12 is a timing chart of the fractional part calculator circuit of the frequency synthesizer device according to the fourth embodiment of the present invention.

FIG. 11 is a view showing a configuration of the fractional part calculator circuit 70. In FIG. 11, an adder 701 is a circuit that detects the fractional part by calculating the binomial coefficient. Delay circuits 702 to 707, 711 to 716 are circuits that generates the binomial coefficient, that is represented by the Pascal's triangle, sequentially by delaying the carry signal of the accumulator.

An operation of the frequency synthesizer device constructed as above according to the fourth embodiment of the present invention will be explained hereunder. The operations of elements other than the frequency-division ratio control circuit 5 are similar to the background art shown in FIG. 21. The output fdiv of the variable frequency divider 4 and the signal fdiv2 obtained by delaying fdiv are used as the operation clocks of the accumulator portion 81.

The accumulator 841 at the first stage shown in FIG. 9 adds fractional part data that are set by the outside and an output of the register by using the adder, and then updates a value of the register using fdiv as the clock. The accumulator 842 at the second stage adds an output of the register and an output of the register in the accumulator 841 by using the adder, and then updates a value of the register using fdiv2 as the clock. The accumulators 843, 844 execute the same operation as the accumulator 842.

Behaviors of change in the operations of the adders and the registers, by the clocks, in the accumulators connected in this manner are shown in a timing chart in FIG. 10. The register in the accumulator 841 updates the data supplied from the adder in synchronism with fdiv. The adder executes the operation in respective bits sequentially, and then outputs the carry signal if the carry occurs. The adder in the succeeding stage executes the operation when receives the data of the register at the preceding stage, that are changed at the timing of fdiv. The register in the accumulator 842 updates the data supplied from the adder in synchronism with fdiv2. The accumulators 843, 844 update the data of the register in synchronism with fdiv2, like the accumulator 842. That is, the change points of the data in the accumulator are distributed by using fdiv and fdiv2, so that the circuit operation does not concentrate into one timing.

FIG. 11 is a view showing a configuration of the fractional part calculator circuit 70. A difference from the configuration in the background art is that delay circuits 711 to 716 are provided. These delay circuits are needed to match respective timings of the addition because respective stages are connected to the succeeding stages via the register in configuration of the accumulator portion. This behavior is shown in a timing chart of FIG. 12. The accumulator at the first stage delays the signal by three clocks using fdiv2 until the calculated result is transmitted to the fourth stage after such calculated result is input into the succeeding stage by fdiv2. The accumulator at the second stage delays the signal by two clocks using fdiv, and the accumulator at the third stage delays the signal by one clock using fdiv. Accordingly, the calculated result of the accumulator can be transmitted precisely to the adder 701 at the timing of fdiv.

A one-chip radio portion device can be constructed by integrating the frequency synthesizer device, the transmitter portion, and the receiver portion on the same semiconductor substrate. The frequency synthesizer device or the one-chip radio portion device can be installed on the mobile radio device such as the mobile telephone, etc.

As described above, according to the fourth embodiment of the present invention, the delay element is provided to the frequency-division ratio control circuit, and also the output signal of the variable frequency divider and the delayed signal of the output signal are employed as operation clocks of the accumulator portion. Therefore, the variation in the substrate potential and the variation in the power supply voltage generated by the operation of the frequency-division ratio control circuit can be reduced. Also, the degradation of C/N of the frequency synthesizer can be reduced, and also the lock-up time can be reduced. In addition, the power consumption in the intermittent operation can be reduced, and also the influence of the noises upon other blocks constructed on the same substrate can be reduced. Furthermore, a plurality of accumulators are connected to the accumulators in the succeeding stages via the outputs of the registers in respective stages. Therefore, the calculated result of the adder is never transmitted sequentially to the adder in the accumulator at the succeeding stage to thus reduce the overall circuit operation time, and therefore the noise reducing effect can be achieved rather than the first embodiment.

(Fifth Embodiment)

A fifth embodiment of the present invention provides a frequency synthesizer device in which the output signal of the variable frequency divider and the reference signal are employed as operation clocks of the accumulator portion, a plurality of accumulators are separated into two half portions in number (almost half the number if the number of the accumulators is the odd number), the registers at the odd-numbered stages are operated by using the reference signal as the clock and the registers at the even-numbered stages are operated by using the output of the variable frequency divider as the clock, and a plurality of accumulators are connected to the accumulators in the succeeding stages via the outputs of the registers in respective stages.

Figure 13:
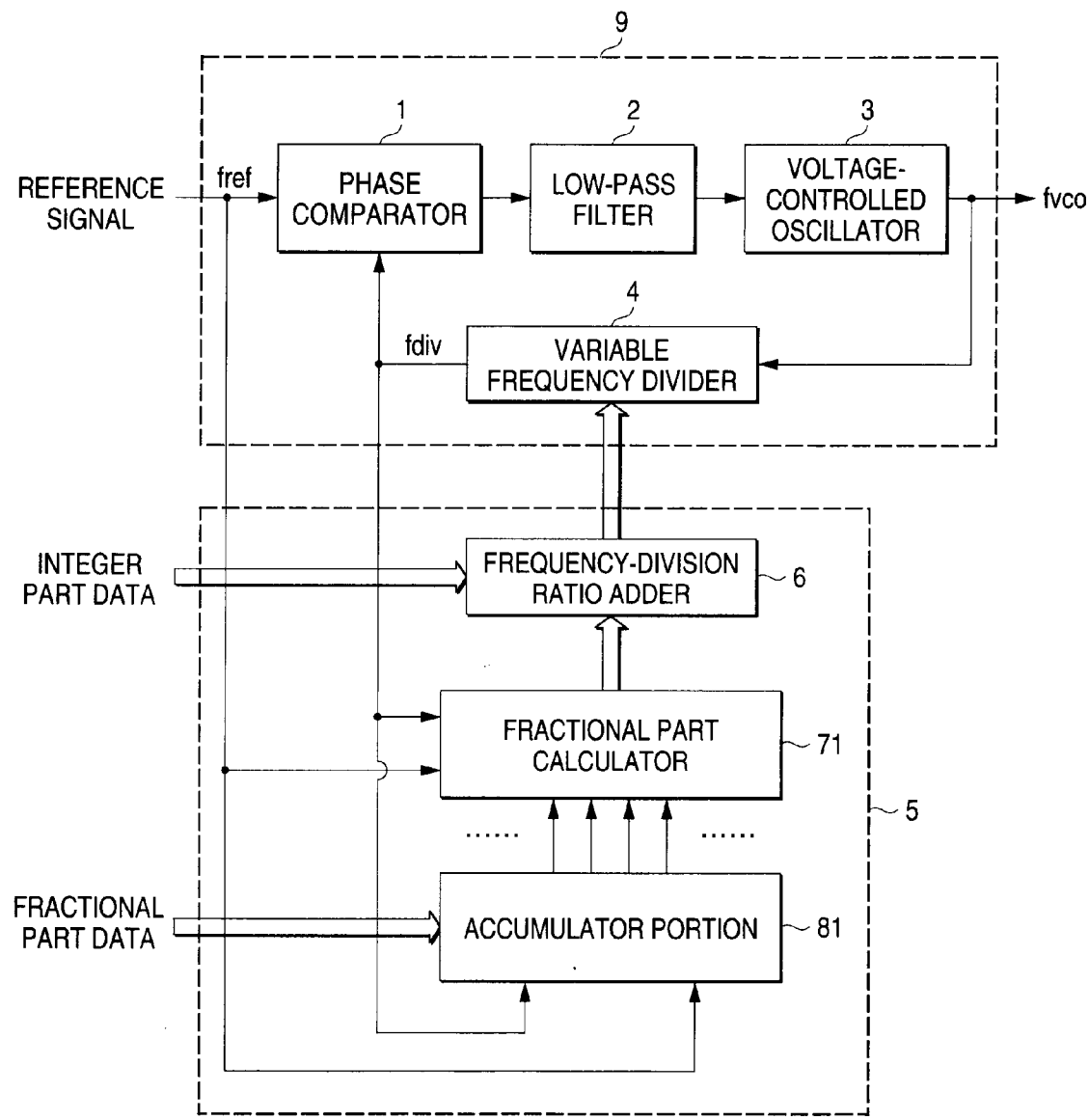
FIG. 13 is a view showing a configuration of a frequency synthesizer device according to a fifth embodiment of the present invention.

FIG. 13 is a view showing a configuration of a frequency synthesizer device according to a fifth embodiment of the present invention. In FIG. 13, a configuration of the accumulator portion 81, a configuration of the fractional part calculator circuit 71, and the use of two signals fdiv and fref as the clocks are different from the configuration in the fourth embodiment.

Figure 14:
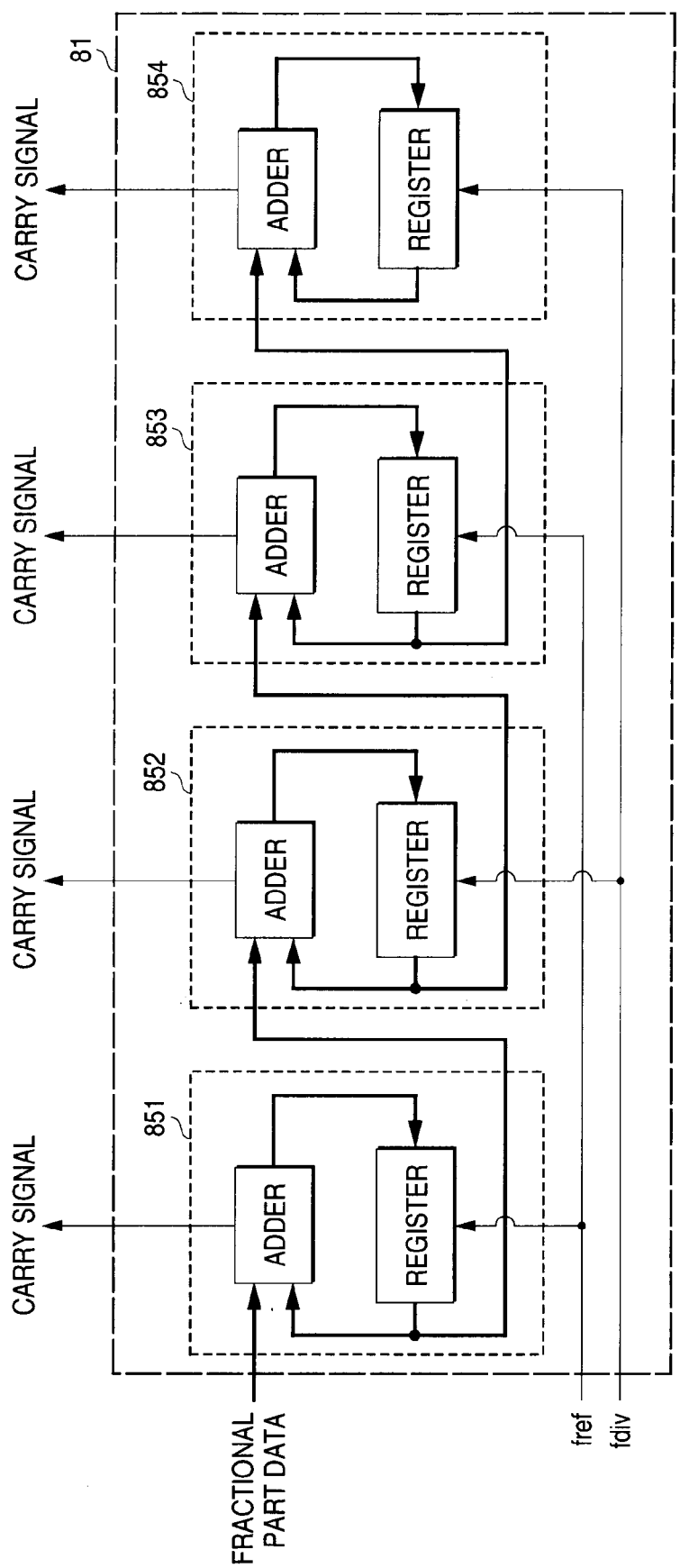
FIG. 14 is a view showing a configuration of an accumulator of the frequency synthesizer device according to the fifth embodiment of the present invention.

FIG. 14 is a view showing a configuration of the accumulator portion 81. The accumulator portion 81 includes accumulators 851 to 854, and each accumulator has the adder and the register.

Figure 15:
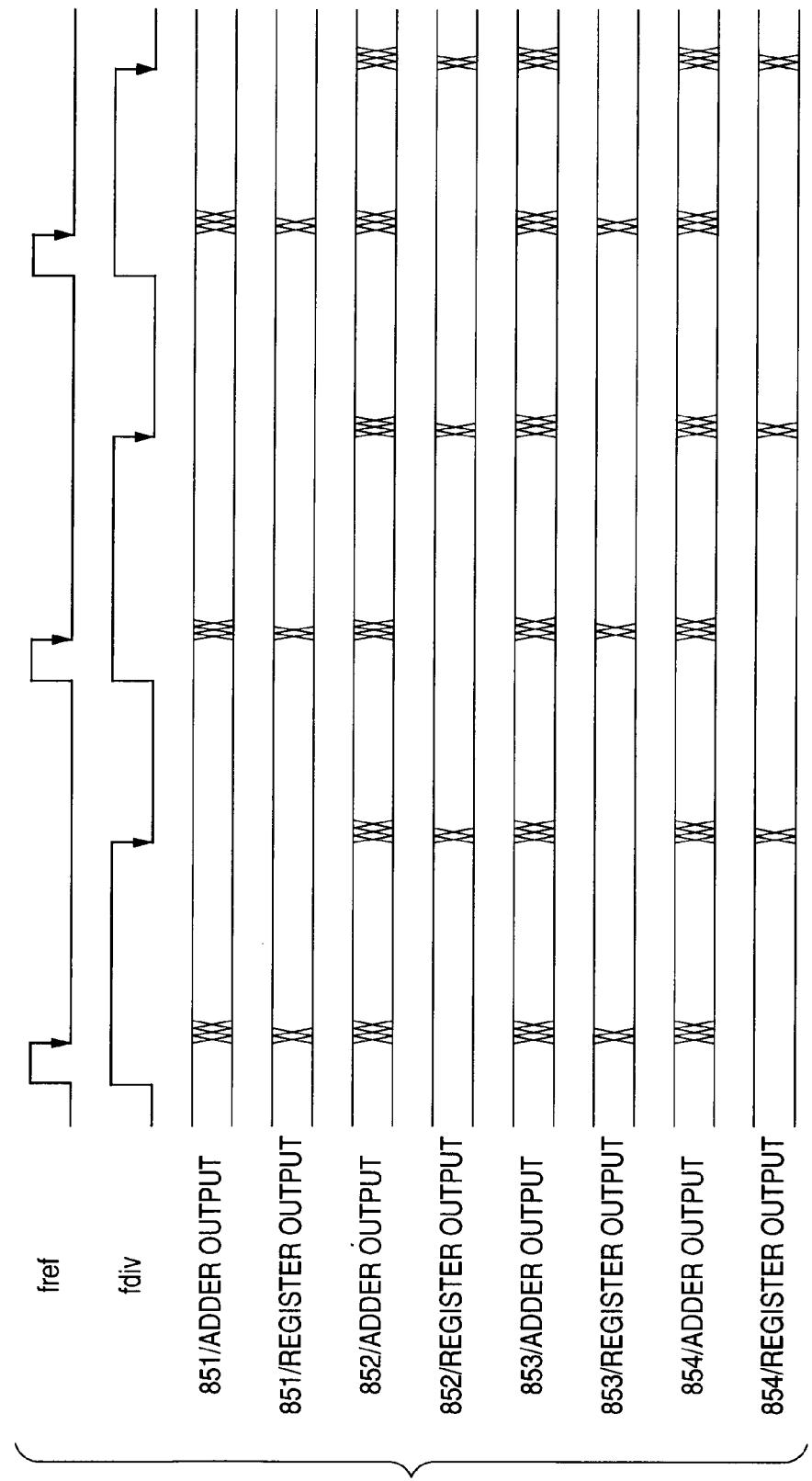
FIG. 15 is a timing chart of the accumulator of the frequency synthesizer device according to the fifth embodiment of the present invention.
Figure 16:
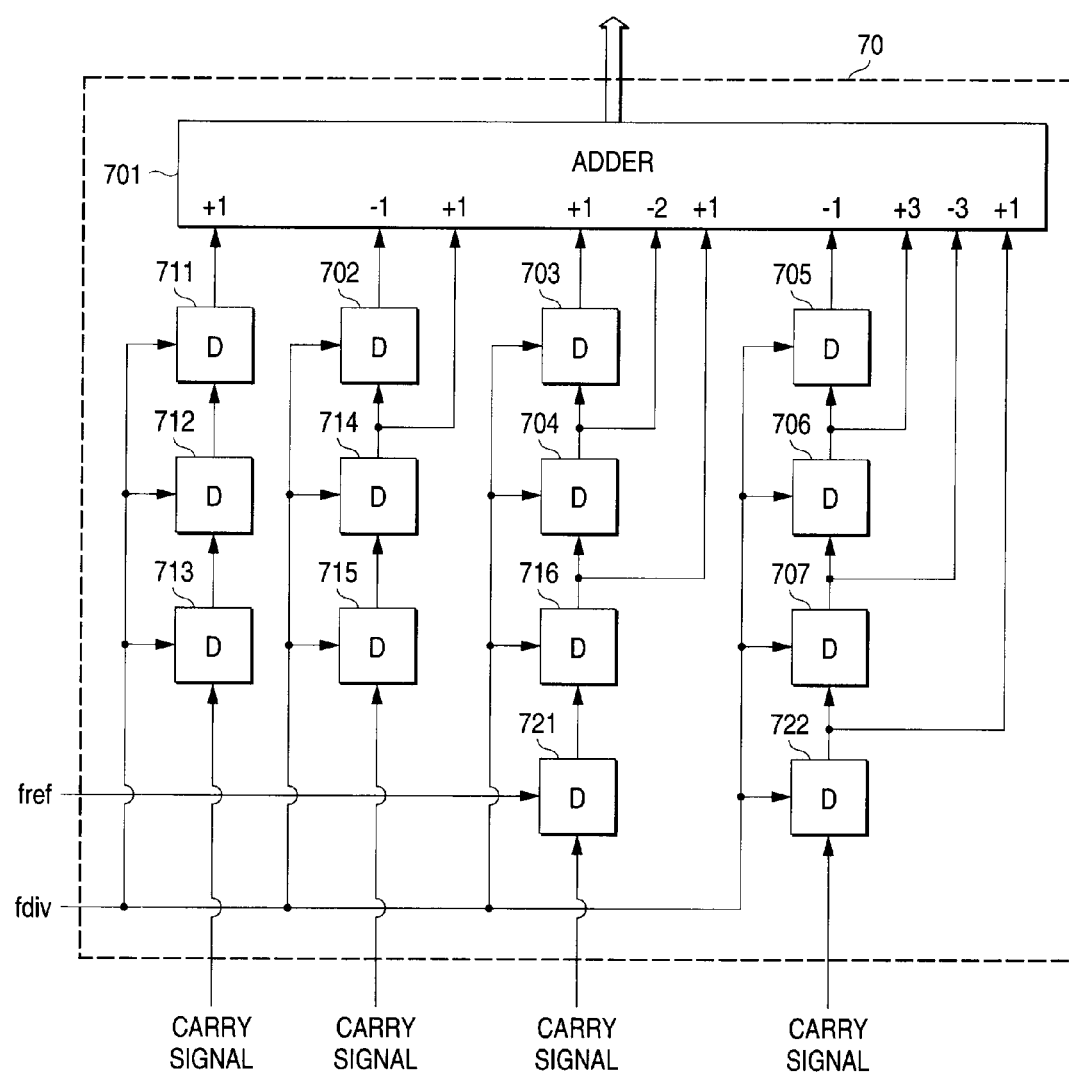
FIG. 16 is a view showing a configuration of a fractional part calculator circuit of the frequency synthesizer device according to the fifth embodiment of the present invention.
Figure 17:
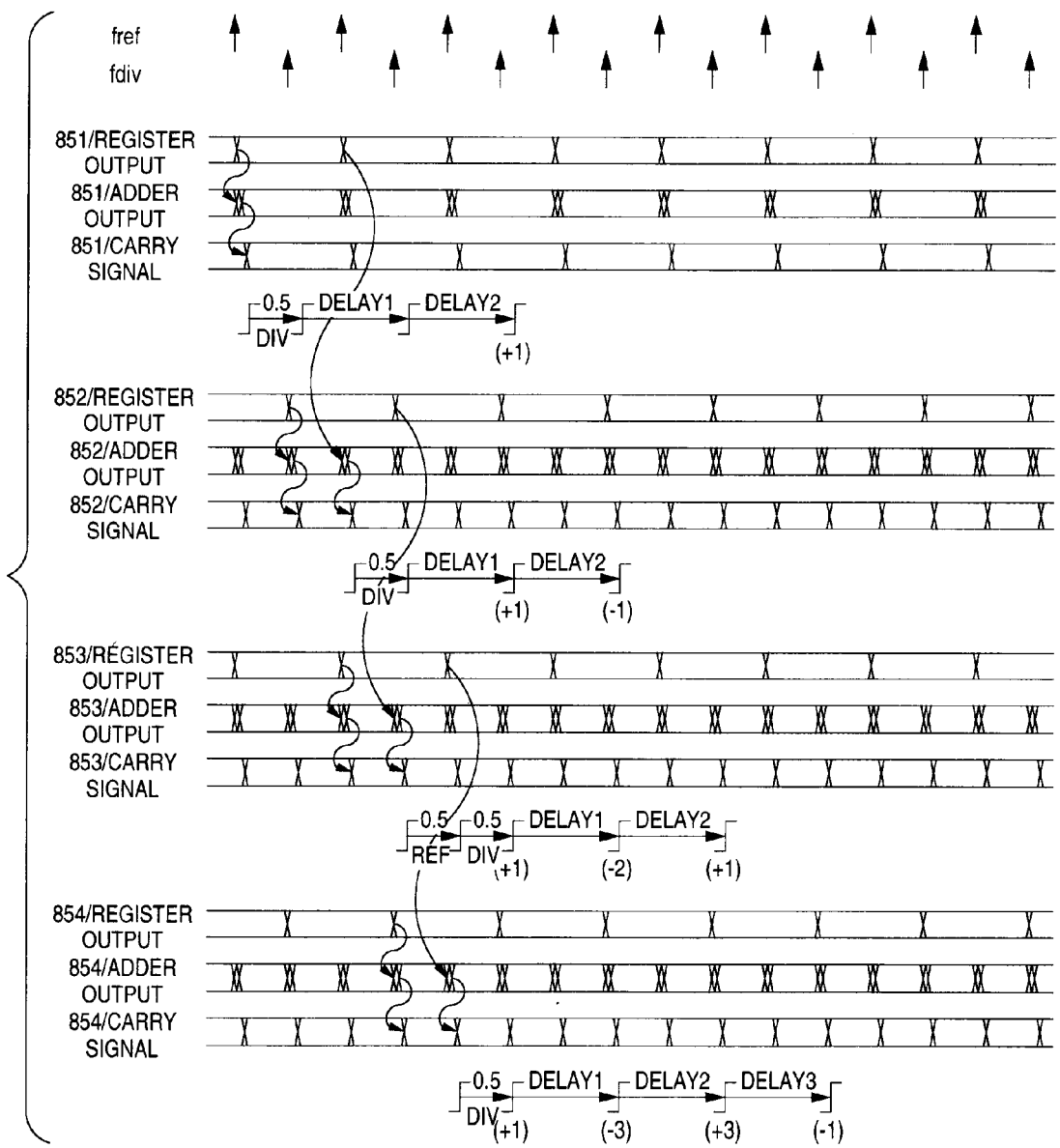
FIG. 17 is a timing chart of the fractional part calculator circuit of the frequency synthesizer device according to the fifth embodiment of the present invention.

FIG. 15 is a timing chart showing behaviors of change in the operations of the adders and the registers in the accumulators by the clocks. FIG. 16 is a functional block diagram of the fractional part calculator circuit 71.

An operation of the frequency synthesizer device constructed as above according to the fifth embodiment of the present invention will be explained hereunder. The operations of elements other than the frequency-division ratio control circuit 5 are similar to the background art shown in FIG. 21.

The accumulator 851 at the first stage adds fractional part data that are set by the outside and an output of the register by using the adder, and then updates a value of the register using fref as the clock. The accumulator 852 at the second stage adds an output of the register and an output of the resister in the accumulator 851 by using the adder, and then updates a value of the register using fdiv as the clock. The accumulator 853 at the third stage adds an output of the register and an output of the register in the accumulator 852 by using the adder, and then updates a value of the register using fref as the clock. The accumulator 854 at the fourth stage adds an output of the register and an output of the register in the accumulator 853 by using the adder, and then updates a value of the register using fdiv as the clock.

Behaviors of change in the operations of the adders and the registers, by the clocks, in the accumulators connected in this manner are shown in a timing chart in FIG. 15. The registers in the accumulator 851 and the accumulator 853 update the data supplied from the adders in synchronism with fref. The adders execute the operation in respective bits in sequence, and then outputs the carry signal if the carry occurs. The registers in the accumulator 852 and the accumulator 854 update the data supplied from the adders in synchronism with fdiv. The adders execute the operation in respective bits in sequence, and then outputs the carry signal if the carry occurs. That is, the change points of the data in the accumulator are distributed by using fref and fdiv, so that the circuit operation does not concentrate into one timing.

FIG. 16 is a functional block diagram of a fractional part calculator circuit 71. A difference from the configuration in the fourth embodiment is that a delay circuit 721 and a delay circuit 722 are provided. These delay circuits are needed to match respective timings of the addition because clock timings of the accumulator portion are changed. This behavior is shown in a timing chart of FIG. 17. In order to render the output at the fourth stage to synchronize, the calculated result of the accumulator at the first stage is delayed by 2.5 clocks using fdiv, the calculated result of the accumulator at the second stage is delayed by 1.5 clocks using fdiv, the calculated result of the accumulator at the third stage is delayed by 0.5 clock using fref and by 0.5 clock using fdiv, and the calculated result of the accumulator at the fourth stage is delayed by 0.5 clock using fdiv. Accordingly, the calculated result of the accumulator can be transmitted precisely to the adder 701 at the timing of fdiv.

A one-chip radio portion device can be constructed by integrating the frequency synthesizer device, the transmitter portion, and the receiver portion on the same semiconductor substrate. The frequency synthesizer device or the one-chip radio portion device can be installed on the mobile radio device such as the mobile telephone, etc.

As described above, according to the fifth embodiment of the present invention, the output signal of the variable frequency divider and the reference signal are employed as operation clocks of the accumulator portion, a plurality of accumulators are separated into two half portions in number (almost half the number if the number of the accumulators is the odd number), the registers at the odd-numbered stages are operated by using the reference signal as the clock and the registers at the even-numbered stages are operated by using the output of the variable frequency divider as the clock. Therefore, the variation in the substrate potential and the variation in the power supply voltage generated by the operation of the frequency-division ratio control circuit can be reduced. Also, the degradation of C/N of the frequency synthesizer can be reduced, and also the lock-up time can be reduced. In addition, the power consumption in the intermittent operation can be reduced, and also the influence of the noises upon other blocks constructed on the same substrate can be reduced. Furthermore, the delay element used in the fourth embodiment is not needed by using fref and fdiv as the clock. Therefore, the optimization of the delay element and phase adjustment between two clock signals due to variation can be eliminated.

(Sixth Embodiment)

A sixth embodiment of the present invention provides a frequency synthesizer device in which the output signal of the variable frequency divider and the reference signal are employed as operation clocks of the accumulator portion, and a plurality of accumulators are connected to the succeeding stages via the outputs of the registers in respective stages.

In a configuration of the frequency synthesizer device according to the sixth embodiment of the present invention, a difference from the fourth embodiment is a configuration of an accumulator portion 81.

Figure 18:
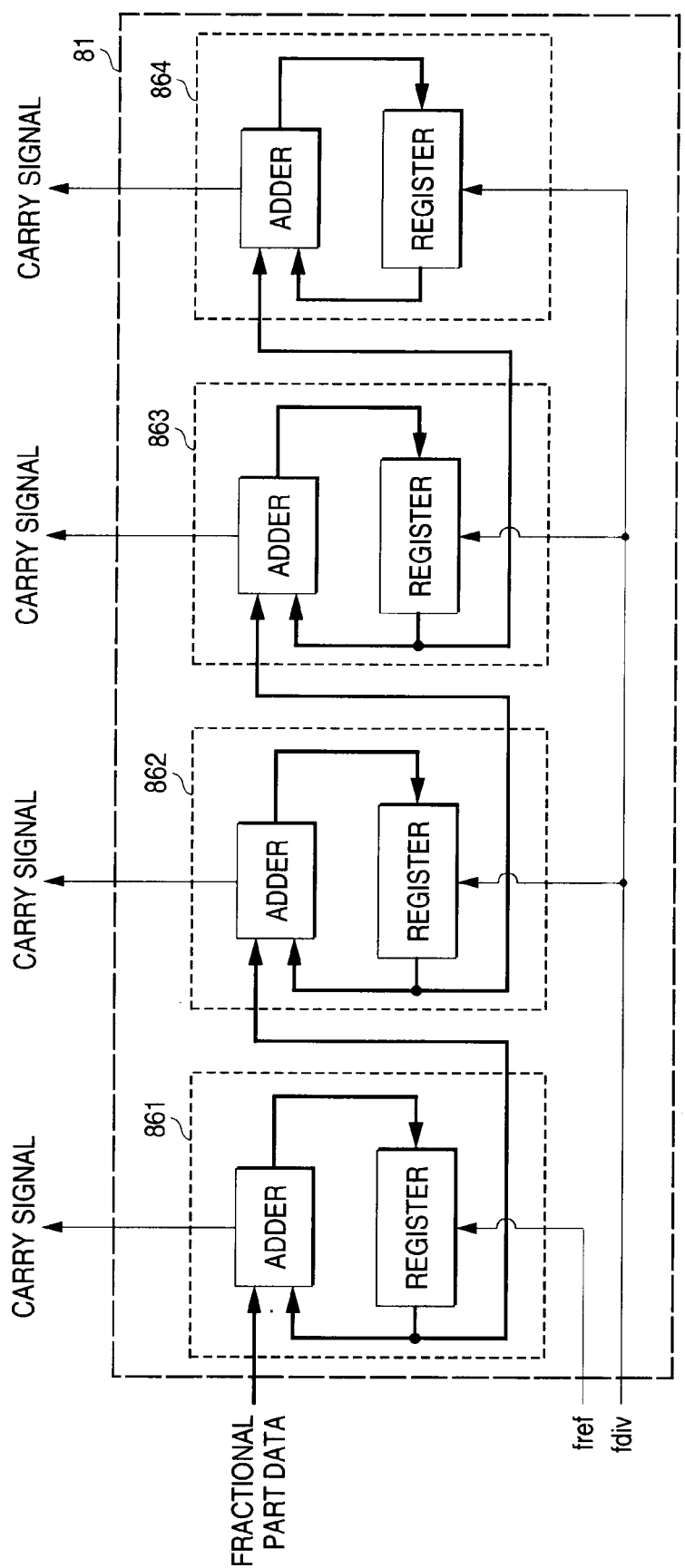
FIG. 18 is a view showing a configuration of an accumulator of the frequency synthesizer device according to a sixth embodiment of the present invention.

FIG. 18 is a view showing the configuration of the accumulator portion 81. The accumulator portion 81 includes accumulators 861 to 864, and each accumulator has the adder and the register.

An operation of the frequency synthesizer device constructed as above according to the sixth embodiment of the present invention will be explained hereunder. The operations of elements other than the frequency-division ratio control circuit 5 are similar to the background art shown in FIG. 21.

The accumulator 861 at the first stage adds fractional part data that are set by the outside and an output of the register by using the adder, and then updates a value of the register using fref as the clock. The accumulator 862 at the second stage adds an output of the register and an output of the register in the accumulator 861 by using the adder, and then updates a value of the register using fdiv as the clock. The accumulators 863, 864 execute the similar operation to the accumulator 862.

Figure 19:
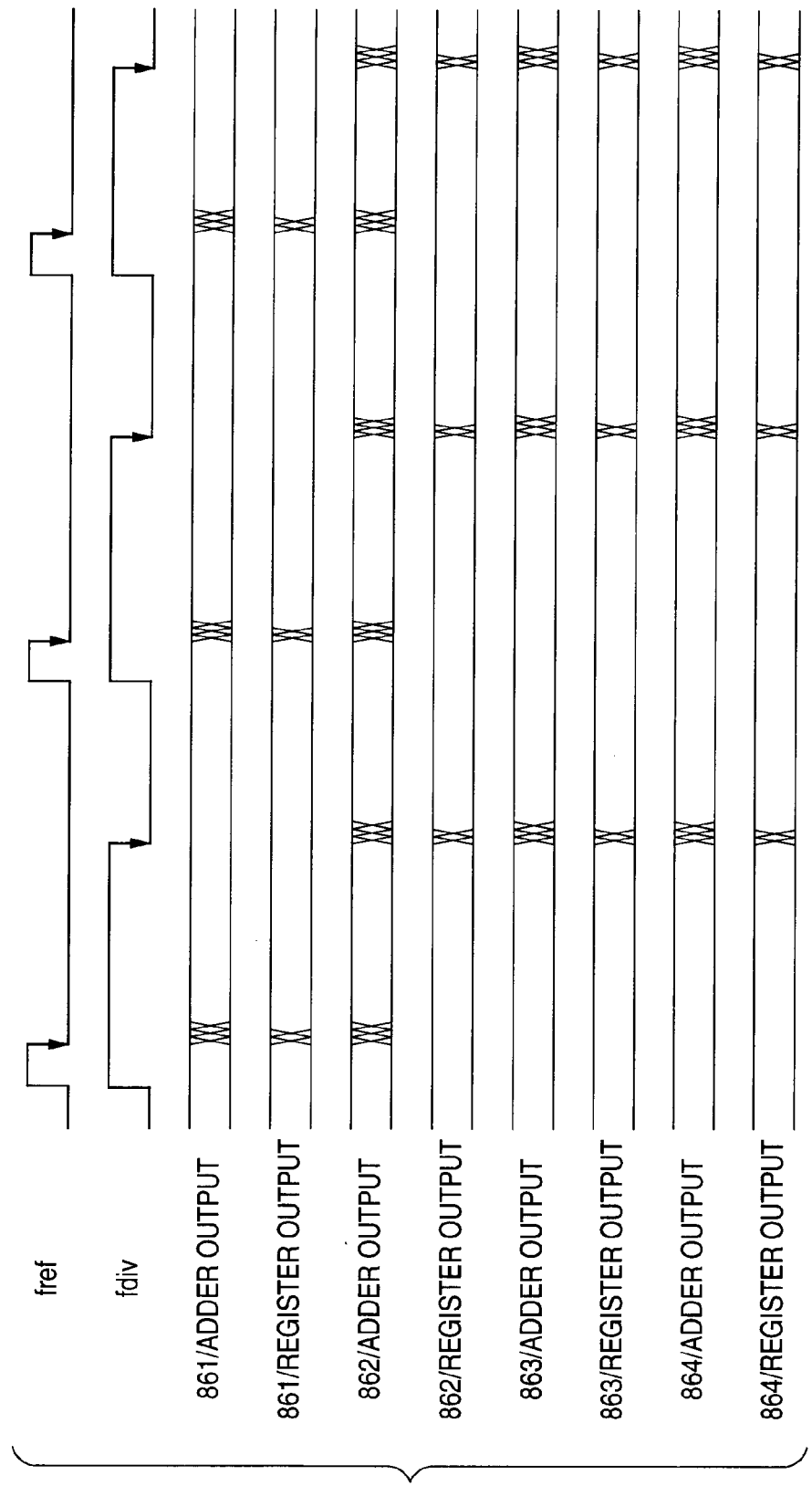
FIG. 19 is a timing chart of the accumulator of the frequency synthesizer device according to the sixth embodiment of the present invention.

Behaviors of change in the operations of the adders and the registers, by the clocks, in the accumulators connected in this manner are shown in a timing chart in FIG. 19. The register in the accumulator 861 updates the data supplied from the adder in synchronism with fref. The adder executes the operation in respective bits in sequence, and then outputs the carry signal if the carry occurs. The adder in the succeeding stage executes the operation when it receives the change in the data. The register in the accumulator 862 updates the data supplied from the adder in synchronism with fdiv. The accumulator 863 and the accumulator 864 update the data of the register in synchronism with fdiv, like the accumulator 862. That is, the change points of the data in the accumulator are distributed by using fref and fdiv, so that the circuit operation does not concentrate into one timing.

A one-chip radio portion device can be constructed by integrating the frequency synthesizer device, the transmitter portion, and the receiver portion on the same semiconductor substrate. The frequency synthesizer device or the one-chip radio portion device can be installed on the mobile radio device such as the mobile telephone, etc.

As described above, according to the sixth embodiment of the present invention, the output signal of the variable frequency divider and the reference signal are employed as operation clocks of the accumulator portion. Therefore, the variation in the substrate potential and the variation in the power supply voltage generated by the operation of the frequency-division ratio control circuit can be reduced. Also, the degradation of C/N of the frequency synthesizer can be reduced, and also the lock-up time can be reduced. In addition, the power consumption in the intermittent operation can be reduced, and also the influence of the noises upon other blocks constructed on the same substrate can be reduced. Furthermore, the delay element used in the fourth embodiment is not needed by using fref and fdiv as the clock. Therefore, the optimization of the delay element and phase adjustment between two clock signals due to variation can be eliminated. Besides, the overlapped operations between the data update of the register and the data update of the register in the preceding stage can be reduced in operation of the adders, and therefore the noise reducing effect can be achieved rather than the fifth embodiment.

(Seventh Embodiment)

A seventh embodiment of the present invention provides a plurality of frequency synthesizer devices in which reference signals that have different phase respectively are distributed to a plurality of accumulators in the frequency synthesizer devices, that are operated at a different clock timing respectively.

Figure 20:
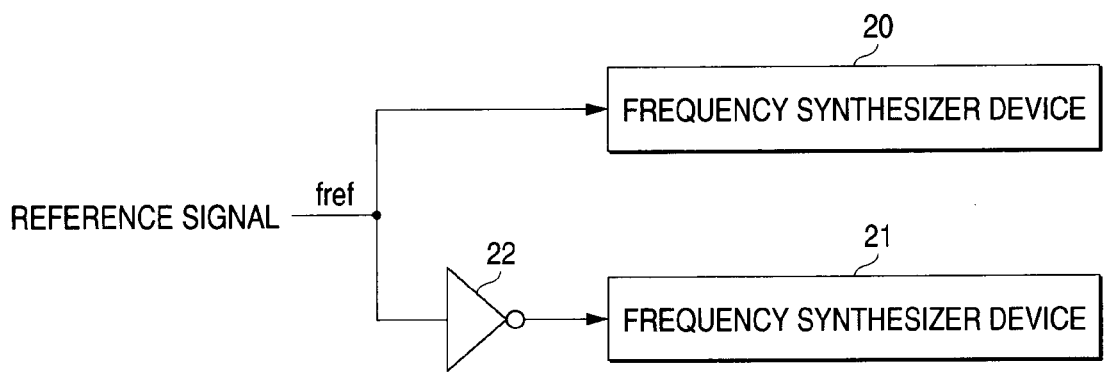
FIG. 20 is a view showing a configuration of a plurality of frequency synthesizer devices according to a seventh embodiment of the present invention.
Figure 21:
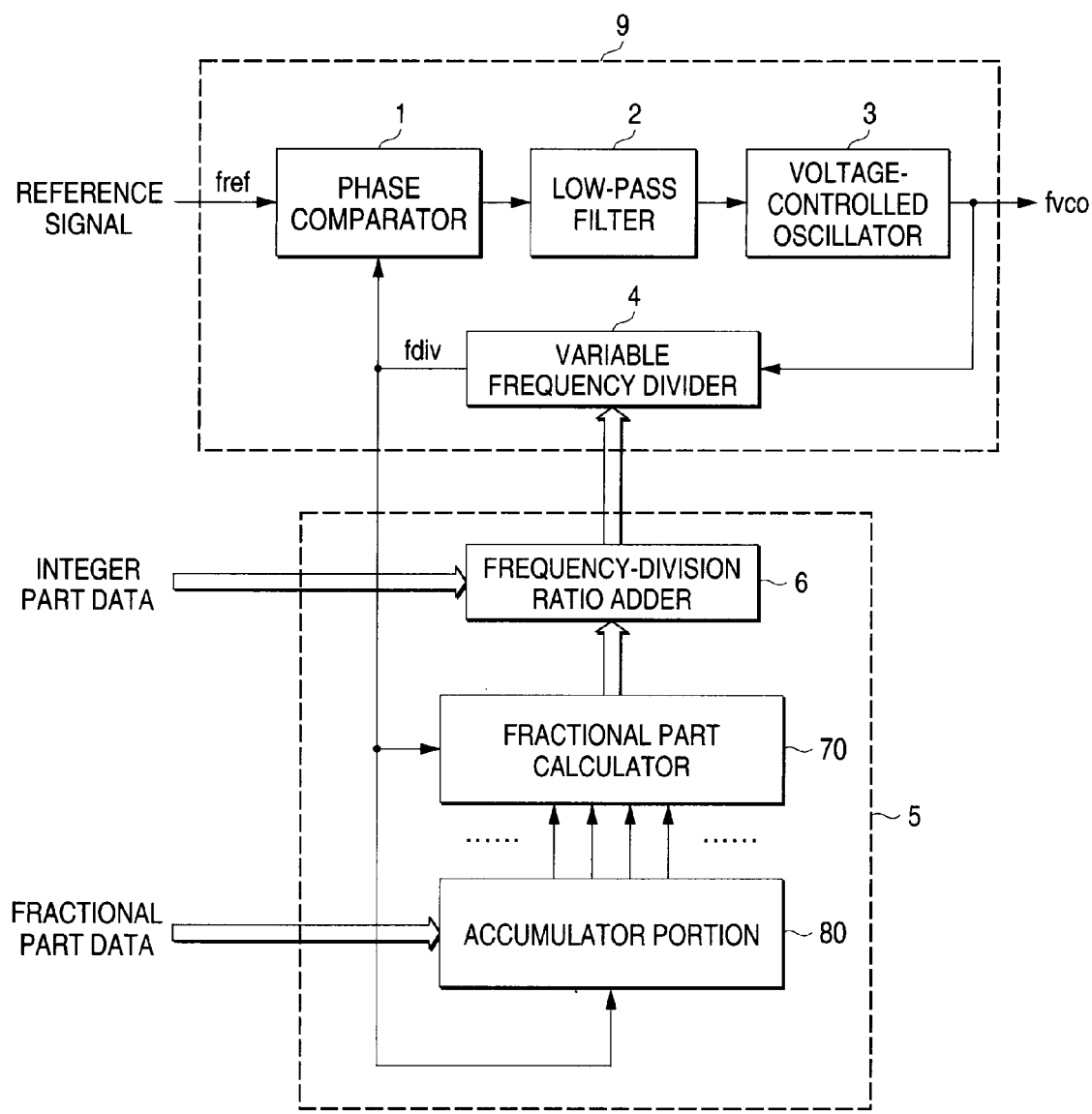
FIG. 21 is a view showing a configuration of a frequency synthesizer device in the background of the invention.
Figure 22:
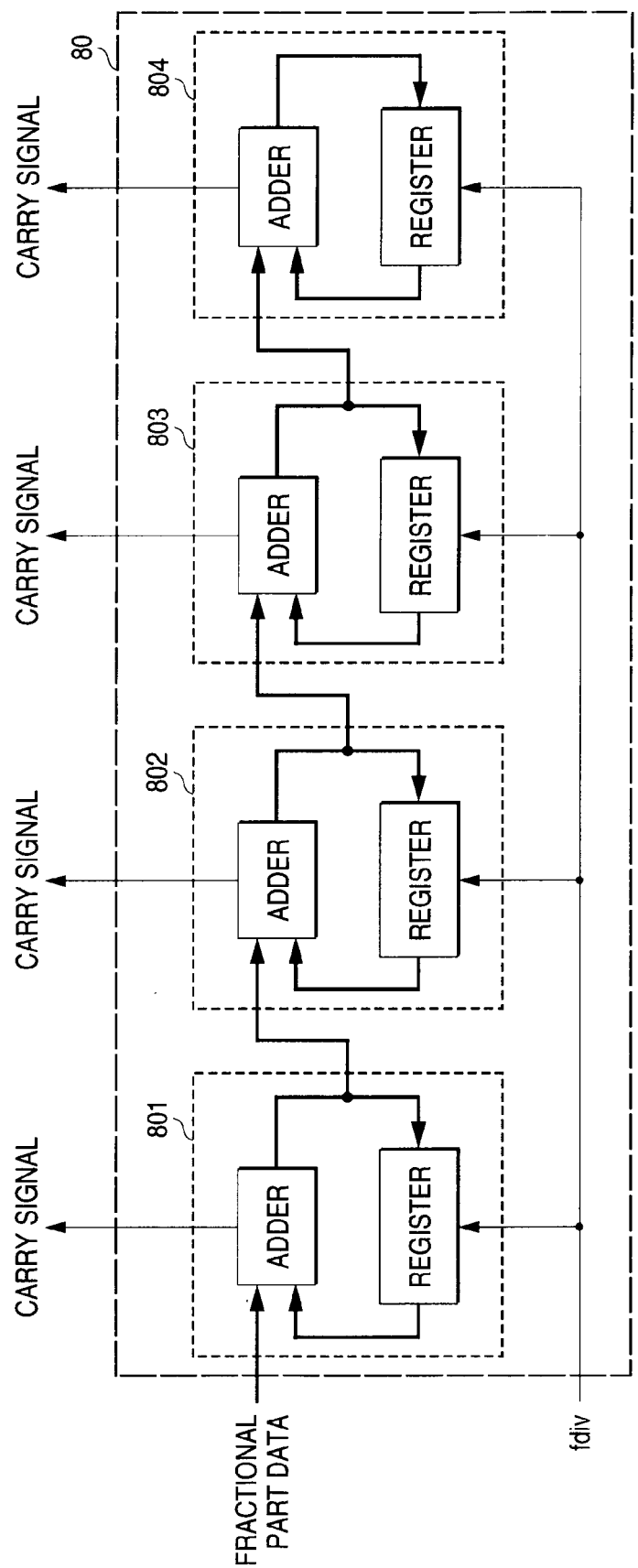
FIG. 22 is a view showing a configuration of an accumulator of the frequency synthesizer device in the background of the invention.
Figure 23:
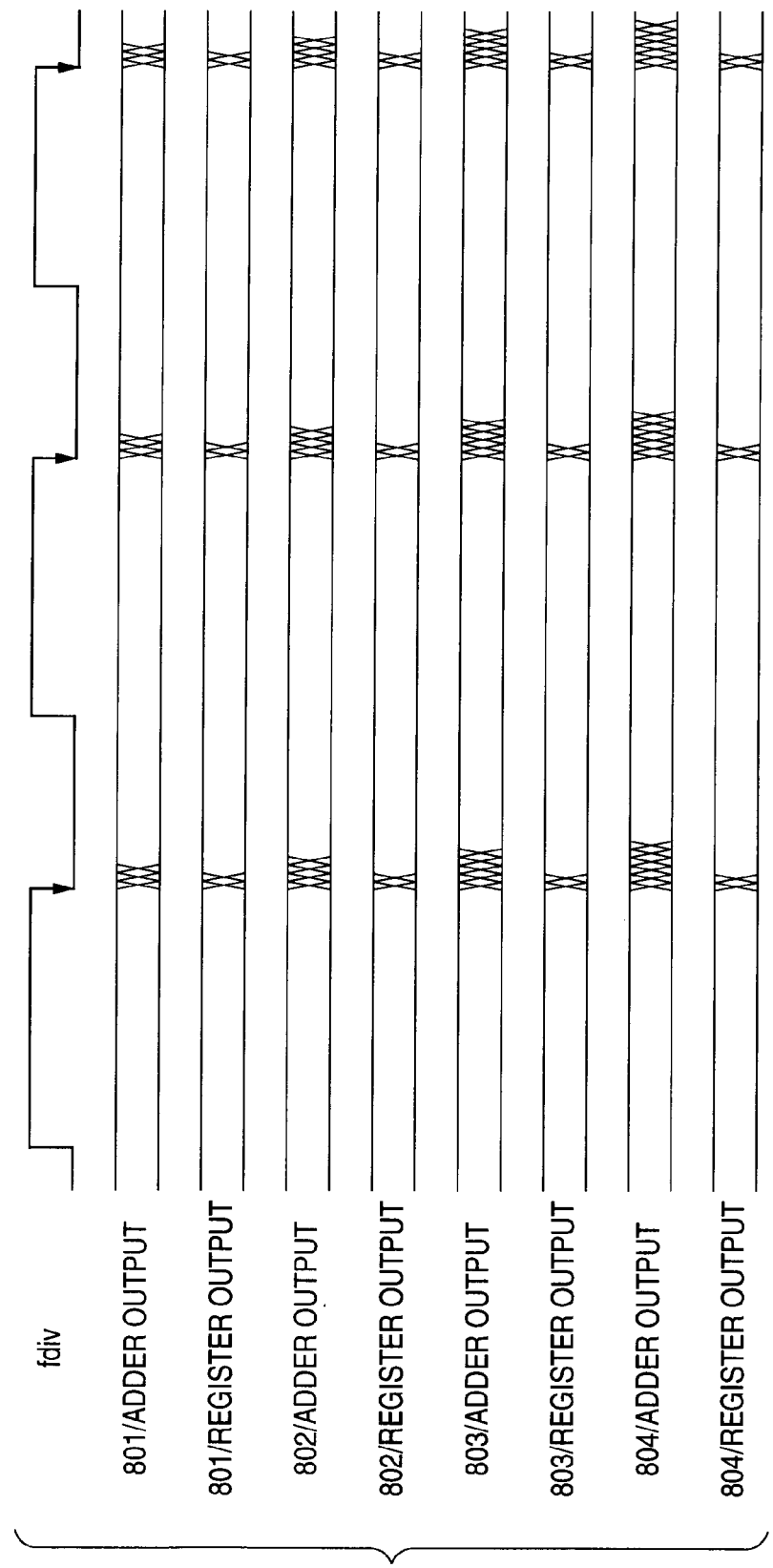
FIG. 23 is a timing chart of the accumulator of the frequency synthesizer device in the background of the invention.
Figure 24:
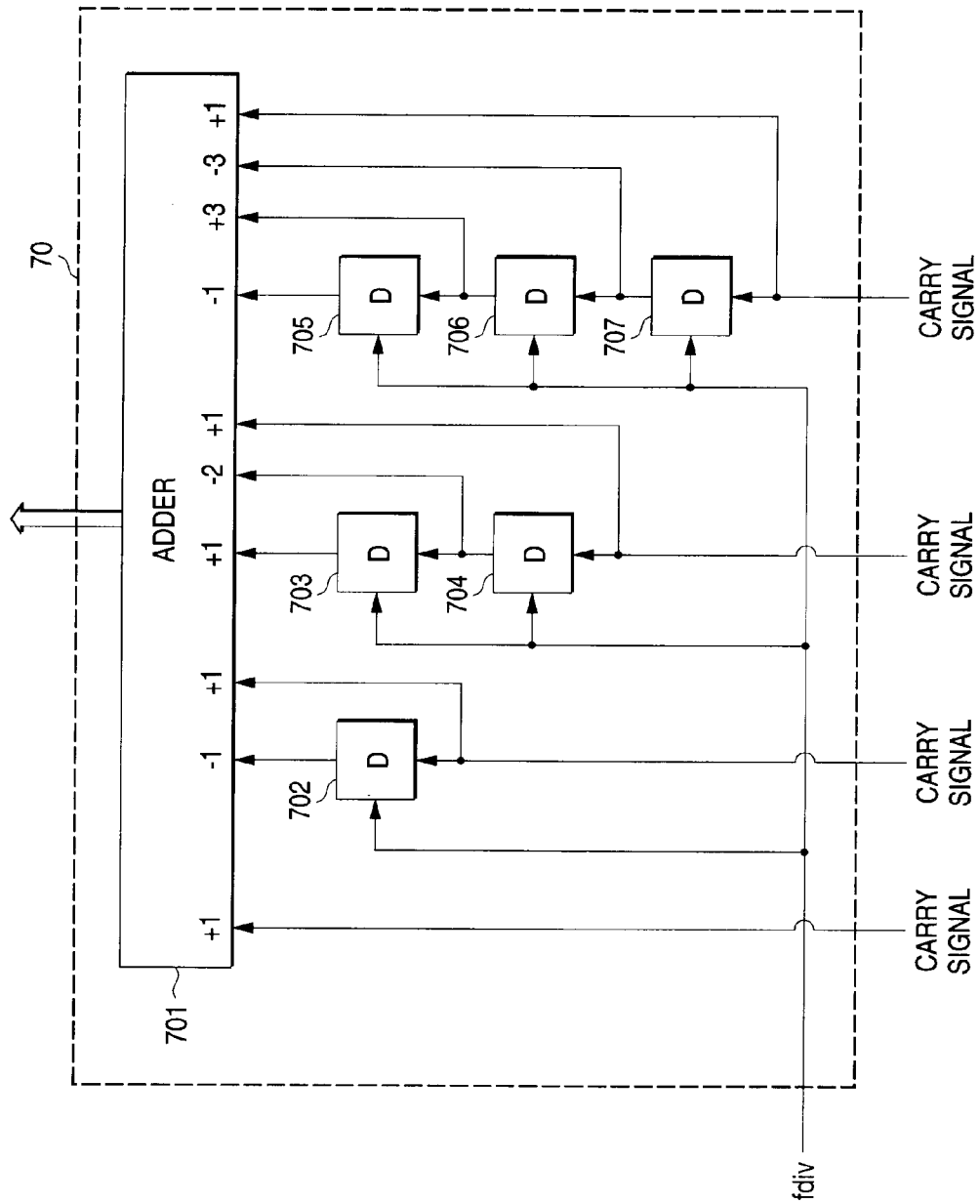
FIG. 24 is a view showing a configuration of a fractional part calculator circuit of the frequency synthesizer device in the background of the invention.
Figure 25:
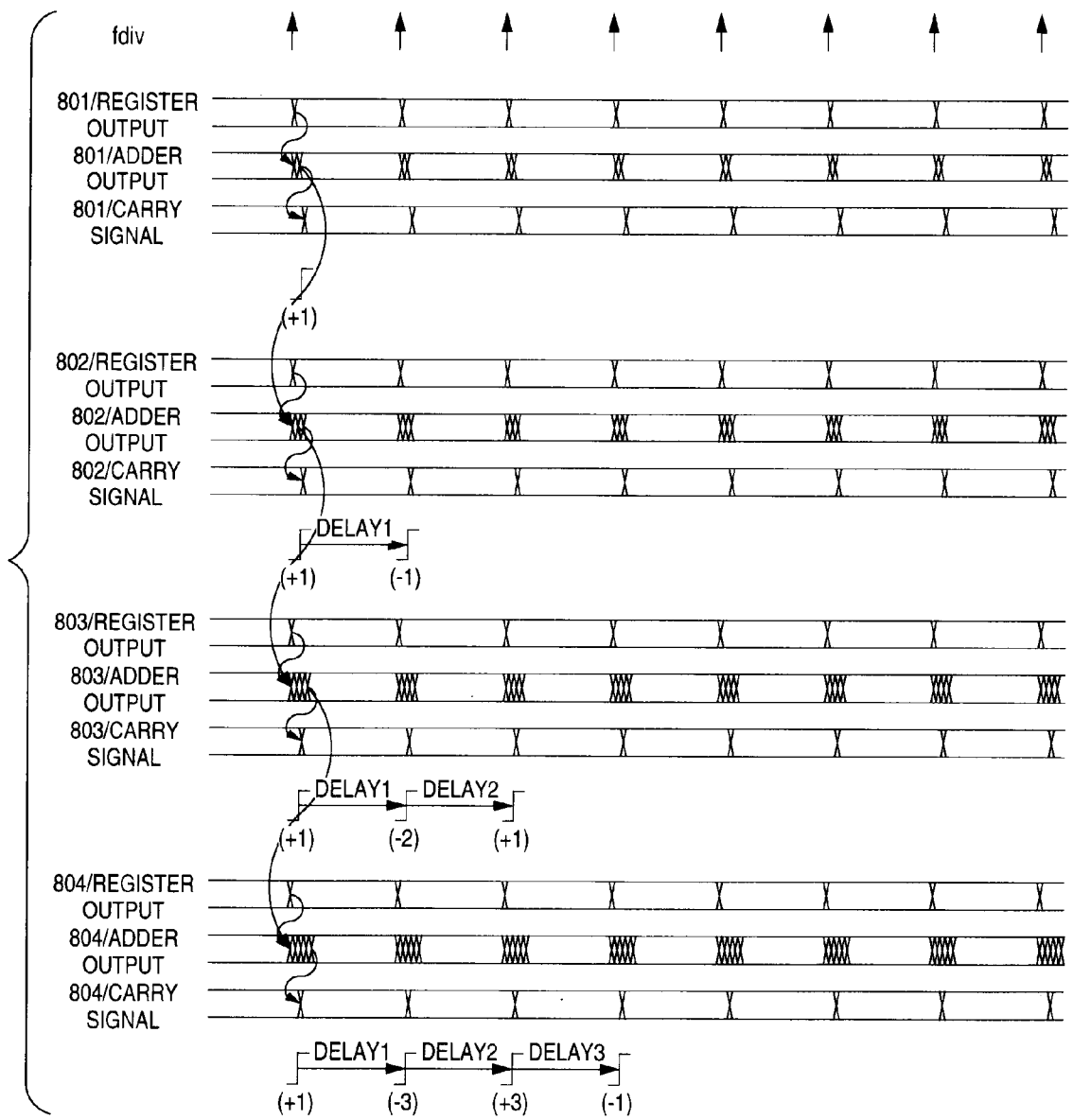
FIG. 25 is a timing chart of the fractional part calculator circuit of the frequency synthesizer device in the background of the invention.

FIG. 20 is a functional block diagram of a plurality of frequency synthesizer devices according to the seventh embodiment of the present invention. In FIG. 20, references 20 and 21 denote any frequency synthesizer device shown in the first to sixth embodiments. An inverter 22 is a circuit that changes the phase of the reference signal.

An operation of the frequency synthesizer device constructed as above according to the seventh embodiment of the present invention will be explained hereunder. The reference signal is input into the frequency synthesizer device 20 without change of phase as it is. A secondary reference signal which is obtained by inverting the phase of the reference signal by using the inverter 22 is input into the frequency synthesizer device 21. According to this configuration, one of the operation clocks for the frequency-division ratio control circuits in two frequency synthesizer devices has surely a different timing. Therefore, the change points of the data in the accumulator are distributed, so that the circuit operation does not concentrate into one timing.

A one-chip radio portion device can be constructed by integrating the frequency synthesizer device, the transmitter portion, and the receiver portion on the same semiconductor substrate. The frequency synthesizer device or the one-chip radio portion device can be installed on the mobile radio device such as the mobile telephone, etc.

As described above, according to the seventh embodiment of the present invention, the reference signals are used while changing their phases respectively. Therefore, the variation in the substrate potential and the variation in the power supply voltage generated by the operation of the frequency-division ratio control circuit can be reduced. Also, the degradation of C/N of the frequency synthesizer can be reduced, and also the lock-up time can be reduced. In addition, the power consumption in the intermittent operation can be reduced, and also the influence of the noises upon other blocks constructed on the same substrate can be reduced.

As apparent from the above explanation, according to the present invention, there can be provided a frequency synthesizer device comprising: a PLL circuit that includes a reference signal inputting means, a phase comparator, a low-pass filter, a voltage-controlled oscillator, and a variable frequency divider; and a frequency-division ratio control circuit including a plurality of accumulators for controlling the variable frequency divider such that a frequency division ratio of the variable frequency divider is changed in time and a time average value of the frequency division ratio contains a value below a decimal point and each having a register and an adder, a fractional part calculator circuit for receiving a carry signal generated by the adder to add binomial coefficients in sequence, and a frequency-division ratio adder for adding an output of the fractional part calculator circuit and integer part data to set the frequency division ratio in the variable frequency divider, wherein the frequency-division ratio control circuit is operated at a plurality of clocks having different timings, whereby a signal having a frequency that is equal to a product of the time average value of the frequency division ratio and a frequency of a reference signal is generated. Therefore, such advantages can be attained that the variation in the substrate potential and the variation in the power supply voltage generated by the operation of the frequency-division ratio control circuit can be reduced, the degradation of C/N of the frequency synthesizer can be reduced, the lock-up time can be reduced, the power consumption in the intermittent operation can be reduced, and the influence of the noises upon other blocks constructed on the same substrate can be reduced.

What is claimed is:

1. A frequency synthesizer device comprising:
   a PLL circuit including a reference signal inputting means, a phase comparator, a low-pass filter, a voltage-controlled oscillator, and a variable frequency divider; and
   a frequency-division ratio control circuit for controlling the variable frequency divider so that a frequency division ratio of the variable frequency divider is changed in time and a time average value of the frequency division ratio contains a value below a decimal point, including:
      a plurality of accumulators each having a register and an adder;
      a fractional part calculator circuit for receiving a carry signal generated by the adder to add binomial coefficients in sequence; and
      a frequency-division ratio adder for adding an output of the fractional part calculator circuit and integer part data to set the frequency division ratio in the variable frequency divider,
   wherein the frequency-division ratio control circuit is operated at a plurality of clocks having different timings,
   whereby a signal having a frequency that is equal to a product of the time average value of the frequency division ratio and a frequency of a reference signal is generated.

2. A frequency synthesizer device according to claim 1, wherein the frequency-division ratio control circuit further includes:
   a means for operating the register of an accumulator at a first stage by using an output of the variable frequency divider as a clock;
   a delay device for operating registers of accumulators at second and subsequent stages by using a delayed signal of the output of the variable frequency divider as the clock;
   a connector for supplying an output of the adder as an input of the accumulator at a succeeding stage; and
   a means for delaying the carry signal longer than the carry signal at a preceding stage by one clock by using a delay circuit of the fractional part calculator circuit that operates using the output of the variable frequency divider as the clock.

3. A frequency synthesizer device according to claim 1, wherein the frequency-division ratio control circuit further includes:
   a means for operating the register of an accumulator at a first stage by using the reference signal as a clock;
   a means for operating registers of accumulators at second and subsequent stages by using an output of the variable frequency divider as the clock;
   a connector for supplying an output of the adder as an input of the accumulator at a succeeding stage; and
   a means for delaying the carry signal longer than the carry signal at a preceding stage by one clock by using a delay circuit of the fractional part calculator circuit that operates using the output of the variable frequency divider as the clock.

4. A frequency synthesizer device according to claim 1, wherein the frequency-division ratio control circuit further includes:
   a means for operating registers of former-half accumulators by using the reference signal as a clock;
   a means for operating registers of latter-half accumulators by using an output of the variable frequency divider as the clock;
   a connector for supplying an output of the adder as an input of the accumulator at a succeeding stage; and
   a means for delaying the carry signal longer than the carry signal at a preceding stage by one clock by using a delay circuit of the fractional part calculator circuit that operates using the output of the variable frequency divider as the clock.

5. A frequency synthesizer device according to claim 1, wherein the frequency-division ratio control circuit further includes:
   a means for operating the register of an accumulator at a first stage by using an output of the variable frequency divider as a clock;
   a delay device for operating registers of accumulators at second and subsequent stages by using a delayed signal of the output of the variable frequency divider as the clock;
   a connector for supplying an output of the register as an input of the accumulator at a succeeding stage; and
   a means for delaying all carry signals by a same amount by using a delay circuit of the fractional part calculator circuit that operates using the output of the variable frequency divider as the clock.

6. A frequency synthesizer device according to claim 1, wherein the frequency-division ratio control circuit further includes:
   a means for operating registers of accumulators at odd-numbered stages by using the reference signal as a clock;
   a means for operating registers of accumulators at even-numbered stages by using an output of the variable frequency divider as the clock;
   a connector for supplying an output of the register as an input of the accumulator at a succeeding stage; and
   a means for matching addition timings of the carry signal by using a delay circuit of the fractional part calculator circuit that operates using two type clocks of the reference signal and the output of the variable frequency divider.

7. A frequency synthesizer device according to claim 1, wherein the frequency-division ratio control circuit further includes:
   a means for operating the register of an accumulator at a first stage operate by using the reference signal as a clock, a means for causing registers of accumulators at second and subsequent stages to operate by using an output of the variable frequency divider as the clock;
   a connector for supplying an output of the register as an input of the accumulator at a succeeding stage; and
   a means for delaying all carry signals by a same amount by using a delay circuit of the fractional part calculator circuit that operates using the output of the variable frequency divider as the clock.

8. A frequency synthesizer device comprising:
   a plurality of frequency synthesizer according to claim 1; and
   a means for generating secondary reference signals having a different phase from a common reference signal and distributing the secondary reference signals.

9. A radio portion device comprising:
frequency synthesizer devices according to claim 1; and
a transmitter portion and a receiver portion;
wherein the transmitter portion and the receiver portion and the frequency synthesizer device are integrated on a same semiconductor substrate.

10. A mobile radio device comprising the frequency synthesizer devices according to claim 1.

11. A mobile radio device comprising the radio portion device according to claim 9.

12. A method of operating a frequency synthesizer device comprising steps of:
inputting fractional part data into an accumulator at a first stage in a frequency-division ratio control circuit that controls a variable frequency divider in a PLL circuit including a reference signal inputting means, a phase comparator, a low-pass filter, a voltage-controlled oscillator, and the variable frequency divider;
generating a carry signal by adding the fractional part data by using accumulators at respective stages in sequence;
calculating a fractional part by generating binomial coefficients in sequence based on the carry signal and adding the binomial coefficients;
calculating a frequency-division ratio whose time average value is changed in time to contain a value below a decimal point by adding integer part data to the fractional part, setting the frequency division ratio in the variable frequency divider; and
generating a signal having a frequency that is equal to a product of the time average value and a frequency of a reference signal is generated,
wherein the accumulators is operated at clocks having different timings.

13. A method of operating a frequency synthesizer device according to claim 12 further includes steps of:
operating the register of an accumulator at a first stage by using an output of the variable frequency divider as a clock;
operating registers of accumulators at second and subsequent stages operate by using a delayed signal of the output of the variable frequency divider as the clock;
adding an output of the adder in the accumulator at a succeeding stage to an output of the register; and
delaying the carry signal longer than the carry signal at a preceding stage by one clock by operating a delay circuit of the fractional part calculator circuit by using the output of the variable frequency divider as the clock.

14. A method of operating a frequency synthesizer device according to claim 12 further comprising steps of:
operating the register of an accumulator at a first stage by using the reference signal as a clock;
operating registers of accumulators at second and subsequent stages by using an output of the variable frequency divider as the clock;
adding an output of the adder in the accumulator at a succeeding stage to an output of the register; and
delaying the carry signal longer than the carry signal at a preceding stage by one clock by operating a delay circuit of the fractional part calculator circuit by using the output of the variable frequency divider as the clock.

15. A method of operating a frequency synthesizer device according to claim 12 further comprising steps of:
operating registers of former-half accumulators by using the reference signal as a clock;
operating registers of latter-half accumulators by using an output of the variable frequency divider as the clock;
adding an output of the adder in the accumulator at a succeeding stage to an output of the register; and
delaying the carry signal longer than the carry signal at a preceding stage by one clock by operating a delay circuit of the fractional part calculator circuit by using the output of the variable frequency divider as the clock.

16. A method of operating a frequency synthesizer device according to claim 12 further comprising steps of:
operating register of an accumulator at a first stage by using an output of the variable frequency divider as a clock;
operating registers of accumulators at second and subsequent stages by using a delayed signal of the output of the variable frequency divider as the clock;
adding an output of the register in the accumulator at a succeeding stage to an output of the register; and
delaying all carry signals by a same amount by operating a delay circuit of the fractional part calculator circuit by using the output of the variable frequency divider as the clock.

17. A method of operating a frequency synthesizer device according to claim 12 further comprising steps of:
operating registers of accumulators at odd-numbered stages by using the reference signal as a clock;
operating registers of accumulators at even-numbered stages by using an output of the variable frequency divider as the clock;
adding an output of the register in the accumulator at a succeeding stage to an output of the register; and
matching addition timings of the carry signal by operating a delay circuit of the fractional part calculator circuit by using two type clocks of the reference signal and the output of the variable frequency divider.

18. A method of operating a frequency synthesizer device according to claim 12 further comprising steps of:
operating the register of an accumulator at a first stage by using the reference signal as a clock;
operating registers of accumulators at second and subsequent stages by using an output of the variable frequency divider as the clock;
adding an output of the register in the accumulator at a succeeding stage to an output of the register; and
delaying all carry signals by a same amount by operating a delay circuit of the fractional part calculator circuit by using the output of the variable frequency divider as the clock.

19. A method of operating a frequency synthesizer device comprising the steps of:
generating a reference signal;
generating a plurality of secondary reference signals having a different phase from the reference signal; and
distributing the secondary reference signals to a plurality of frequency synthesizer devices comprising: a PLL circuit including a reference signal inputting means, a phase comparator, a low-pass filter, a voltage-controlled oscillator, and a variable frequency divider; and a frequency-division ratio control circuit for controlling the variable frequency divider so that a frequency division ratio of the variable frequency divider is changed in time and a time average value of the frequency division ratio contains a value below a decimal point, including a plurality of accumulators each having a register and an adder, a fractional part calculator circuit for receiving a carry signal generated by the adder to add binomial coefficients in sequence, and a frequency-division ratio adder for adding an output of the fractional part calculator circuit and integer part data to set the frequency division ratio in the variable frequency divider, wherein the frequency-division ratio control circuit is operated at a plurality of clocks having different timings.

* * * * *